United States Patent
Huang

(10) Patent No.: US 10,325,981 B2
(45) Date of Patent: Jun. 18, 2019

(54) HIGH-SIDE POWER DEVICE AND MANUFACTURING METHOD THEREOF

(71) Applicant: RICHTEK TECHNOLOGY CORPORATION, Zhubei, HsinChu (TW)

(72) Inventor: Tsung-Yi Huang, HsinChu (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 15/909,989

(22) Filed: Mar. 1, 2018

(65) Prior Publication Data

US 2018/0358432 A1 Dec. 13, 2018

(30) Foreign Application Priority Data

Jun. 12, 2017 (TW) .............................. 106119390 A

(51) Int. Cl.
| | | |
|---|---|---|
| *H01L 29/76* | (2006.01) | |
| *H01L 29/06* | (2006.01) | |
| *H01L 29/78* | (2006.01) | |
| *H01L 29/10* | (2006.01) | |
| *H01L 29/08* | (2006.01) | |
| *H01L 29/66* | (2006.01) | |

(52) U.S. Cl.
CPC ...... *H01L 29/0623* (2013.01); *H01L 29/0882* (2013.01); *H01L 29/1095* (2013.01); *H01L 29/66681* (2013.01); *H01L 29/7816* (2013.01)

(58) Field of Classification Search
CPC ............ H01L 29/0623; H01L 29/1095; H01L 29/66681

See application file for complete search history.

(56) References Cited

U.S. PATENT DOCUMENTS

2002/0017683 A1* 2/2002 Jeon ...................... H01L 21/761
257/339

* cited by examiner

*Primary Examiner* — Samuel A Gebremariam
(74) *Attorney, Agent, or Firm* — Tung & Associates

(57) ABSTRACT

A high-side device includes: a substrate, an epitaxial layer, a high voltage well, a body region, a gate, a source, a drain, two buried regions. A PN junction is formed between the body region and the high voltage well, wherein the PN junction is perpendicular to a channel direction. One buried region is formed in the epitaxial layer and has a first conductive type, wherein an inner side boundary thereof is located between the drain and the PN junction. The other buried region is formed in the substrate and in the epitaxial layer and has a second conductive type, wherein an inner side boundary thereof is located between the drain and the PN junction. The impurity concentration of the second buried region is sufficient to prevent the high voltage well between the PN junction and the drain from being completely depleted when the high-side power device is ON.

32 Claims, 12 Drawing Sheets

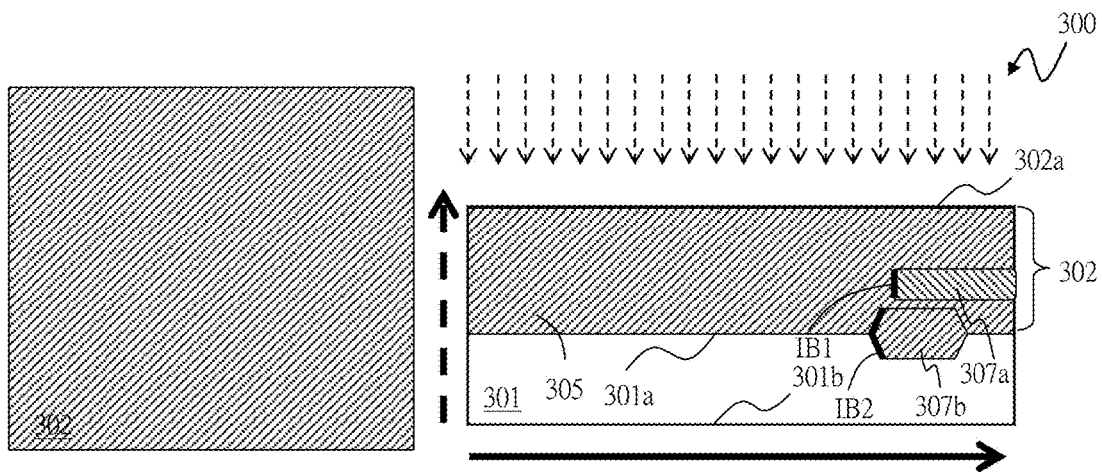
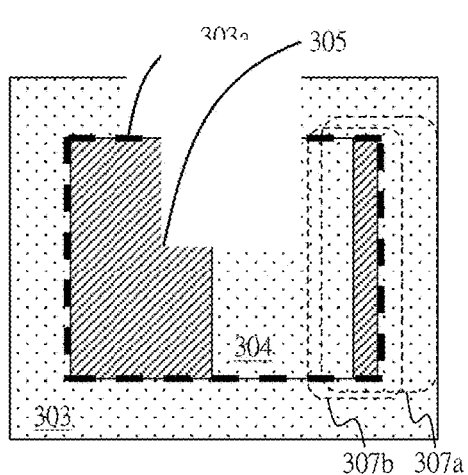
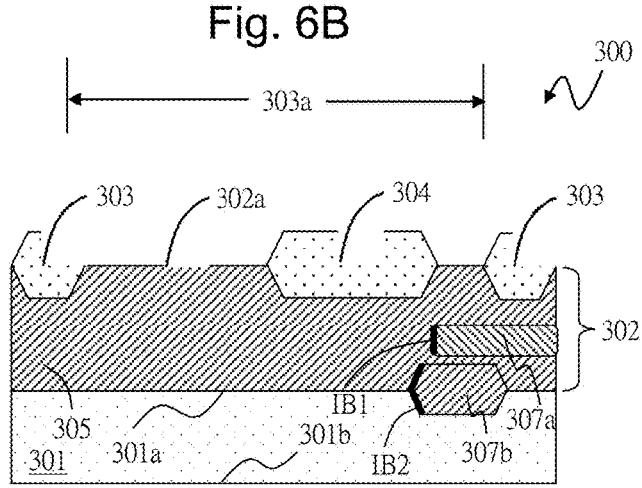
Fig. 6A  Fig. 6B  Fig. 6C  Fig. 6D
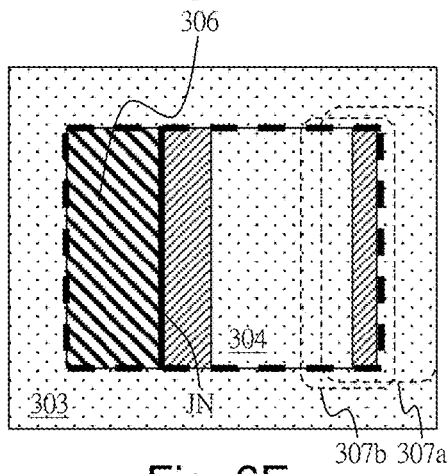
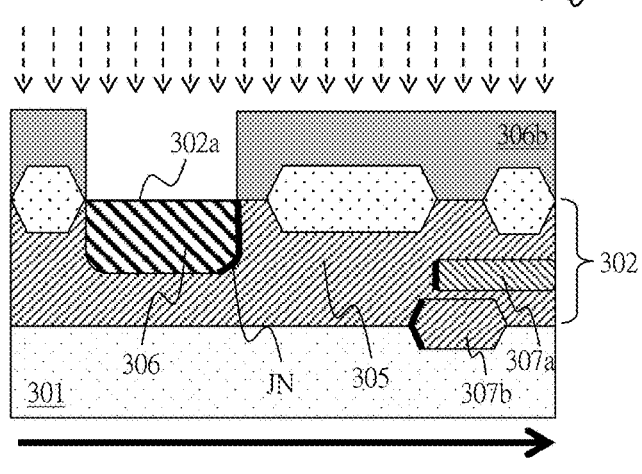
Fig. 6E  Fig. 6F

HIGH-SIDE POWER DEVICE AND MANUFACTURING METHOD THEREOF

CROSS REFERENCE

The present invention claims priority to TW 106119390, filed on Jun. 12, 2017.

BACKGROUND OF THE INVENTION

Field of Invention

The present invention relates to a high-side power device and a manufacturing method thereof; particularly, it relates to such a high-side power device having a relatively lower conductive resistance, and a manufacturing method thereof.

Description of Related Art

FIG. 1A shows a schematic diagram of a typical switching regulator 10. The switching regulator 10 has a high-side switch UG and a low-side switch LG as shown in the figure. A high-side gate driver circuit 13 and a lower gate driver 14 drive the high-side switch UG and the low-side switch LG respectively. A control circuit 11 controls the high-side gate driver circuit 13 (through a level shifter circuit 12) and the lower gate driver circuit 14. The level shifter circuit 12 is required when the input voltage Vin is a high voltage, such as 400V; in this case, the level shifter circuit 12 provides the required level to the high-side gate driver circuit 13 so as to properly drive the high-side switch UG. Although the voltage drops between the operation terminals of the high-side switch UG, such as its source, drain, and gate, are not high relatively to the input voltage Vin, the high-side switch UG is still required to withstand a high voltage drop between the input voltage Vin and the ground level GND, because the high-side switch UG and the low-side switch LG are typically formed in a same substrate, and the substrate is usually electrically connected to the ground level GND.

FIG. 1B shows a schematic diagram of a cross-section view of a prior art high-side power device 100, wherein the high-side switch UG includes the high-side power device 100. As shown in FIG. 1B, The high-side power device 100 includes a substrate 101, an isolation oxide region 103, a high voltage well 105, a body region 106, a source 108, a drain 109, and a gate 111. The high voltage well 105 with an N-type conductive type is formed in the substrate 101 with a P-type conductive type. The isolation oxide region 103 is a local oxidation of silicon (LOCOS) structure, for defining an operation region 103a, as a major active region of the high-side power device 100. In FIG. 1B, two arrows pointing in opposite directions indicates the operation region 103a. When the high-side switch UG includes the high-side power device 100, the substrate 101 of the high-side power device 100 is electrically connected to the ground level GND, but the high voltage well 102 is connected to a relatively high level, and thus when the high-side power device 100 is in conduction, the high voltage well 102 in the operation region 103a is completely depleted to cause a high conductive resistance, whereby the operation speed and performance of the high-side power device 100 are limited.

In view of above, to overcome the drawbacks in the prior art, the present invention proposes a high-side power device having a relatively lower conduction resistance, and a manufacturing method thereof.

SUMMARY OF THE INVENTION

In one perspective, the present invention provides a high-side power device. The high-side power device includes: a substrate with a first conductive type, which includes an upper surface and a lower surface opposite to the upper surface in a vertical direction; an epitaxial layer, which is formed on the substrate, and has an epitaxial surface opposite to the upper surface, wherein the epitaxial layer is stacked on and connected to the upper surface in the vertical direction; a high voltage well, which is formed in the epitaxial layer, and has a second conductive type, wherein the high voltage well is stacked on and connected to the upper surface in the vertical direction; a body region, which is formed in the epitaxial layer, and has the first conductive type, wherein the body region is stacked under and connected beneath the epitaxial surface in the vertical direction; the body region and the high voltage well forming a PN junction in between; a gate, which is formed on the epitaxial layer, wherein at least part of the gate is stacked on and connected to the epitaxial surface in the vertical direction, and wherein the PN junction is located right below the gate from a cross section view, and extends substantially perpendicular to a channel direction from a top view, wherein the gate overlays at least part of the PN junction from the top view; a source, which is formed in the epitaxial layer, and has the second conductive type, wherein the source is stacked under and connected beneath the epitaxial surface in the vertical direction, and the source is located in the body region from the top view; a drain, which is formed in the epitaxial layer, and has the second conductive type, wherein the drain is stacked under and connected beneath the epitaxial surface in the vertical direction, wherein the source and the drain are located at different sides of the PN junction, and the drain is separated from the gate by the high voltage well from the top view; a first buried region, which is formed in the epitaxial layer, and has the first conductive type, wherein the first buried region has a first inner boundary which is an edge of the first buried region that is closest to the gate in the channel direction, wherein the first inner boundary is located between the drain and the PN junction in the channel direction, and the first buried region is not located right below the source; and a second buried region, which is formed in the substrate and the epitaxial layer, and has the second conductive type, wherein a part of the second buried region is located in the substrate, and another part of the second buried region is located in the epitaxial layer and is connected to the high voltage well in the vertical direction, wherein the second buried region has a second inner boundary which is an edge of the second buried region that is closest to the gate in the channel direction, wherein the second inner boundary is located between the drain and the PN junction in the channel direction, wherein the second buried region is not located right below the source; wherein an impurity concentration of the second conductive type of the second buried region and an impurity concentration of the second conductive type of the high voltage well are above a first predetermined level which is sufficient to prevent the high voltage well between the PN junction and the drain from being completely depleted in an ON operation of the high-side power device.

From another perspective, the present invention also provides a manufacturing method of a high-side power device. The manufacturing method includes: providing a substrate with a first conductive type, which includes an upper surface and a lower surface opposite to the upper surface in a vertical direction; forming an epitaxial layer on the substrate, which has an epitaxial surface opposite to the upper surface, and is stacked on and connected to the upper surface in the vertical direction; forming a high voltage well in the epitaxial layer, which has the second conductive type, and is stacked on and connected to the upper surface in the vertical direction; forming a body region in the epitaxial layer, which has the first conductive type, and is stacked under and connected beneath the epitaxial surface in the vertical direction; forming a gate on the epitaxial layer, wherein at least part of the gate is stacked on and connected to the epitaxial surface in the vertical direction, and wherein the PN junction is located right below the gate from a cross section view, and extends substantially perpendicular to a channel direction from a top view, wherein the gate overlays at least part of the PN junction from the top view; forming a source in the epitaxial layer, which has the second conductive type and is stacked under and connected beneath the epitaxial surface in the vertical direction, and the source is located in the body region from the top view; forming a drain in the epitaxial layer, which has the second conductive type and is stacked under and connected beneath the epitaxial surface in the vertical direction, wherein the source and the drain are located at different sides of the PN junction, and the drain is separated from the gate by the high voltage well from the top view; forming a first buried region in the epitaxial layer, which has the first conductive type, wherein the first buried region has a first inner boundary which is an edge of the first buried region that is closest to the gate in the channel direction, wherein the first inner boundary is located between the drain and the PN junction in the channel direction, and the first buried region is not located right below the source; and forming a second buried region in the substrate and epitaxial layer, which has the second conductive type, wherein a part of the second buried region is located in the substrate, and another part of the second buried region is located in the epitaxial layer and is connected to the high voltage well in the vertical direction, wherein the second buried region has a second inner boundary which is an edge of the second buried region that is closest to the gate in the channel direction, wherein the second inner boundary is located between the drain and the PN junction in the channel direction, wherein the second buried region is not located right below the source; wherein an impurity concentration of the second conductive type of the second buried region and an impurity concentration of the second conductive type of the high voltage well are above a first predetermined level which is sufficient to prevent the high voltage well between the PN junction and the drain from being completely depleted in an ON operation of the high-side power device.

In one preferable embodiment, an impurity concentration of the first conductive type of the first buried region and the impurity concentration of the second conductive type of the high voltage well are below a second predetermined level such that the high voltage well between the PN junction and the drain is completely depleted in an OFF operation of the high-side power device.

In one preferable embodiment, the high-side power device further comprises a connection region which has the first conductive type, and is stacked on and contacting the first buried region in the vertical direction, wherein the connection region is for electrically connecting the first buried region, and the first buried region is electrically connected to the body region.

In one preferable embodiment, the high-side power device further comprises a contact region which is formed in the epitaxial layer, and has the first conductive type, wherein the contact region is stacked under and connected beneath the epitaxial surface in the vertical direction, and the contact region is located in the body region from the top view.

In the aforementioned embodiment, the connection region is preferably located outside an operation region in the channel direction or in a width direction which is perpendicular to the channel direction.

In one preferable embodiment, a distance between the PN junction and the drain in the channel direction is a drift length, and a length between the second inner boundary and the drain in the channel direction is longer than a quarter of the drift length.

In one preferable embodiment, the first inner boundary is not located between the second inner boundary and the PN junction in the channel direction.

In one preferable embodiment, the high-side power device further comprises a drift oxide region which is formed on the epitaxial layer and is stacked on and connected to the high voltage well in the vertical direction, wherein part of the gate overlays the drift oxide region, wherein the drift oxide region is located between the PN junction and the drain in the channel direction.

From another perspective, the present invention provides a high-side power device a high-side power device, comprising: a substrate with a first conductive type, which includes a upper surface and a lower surface opposite to the upper surface in a vertical direction; a high voltage well, which is formed beneath the upper surface, and has the second conductive type; a body region, which is formed in the substrate, and has the first conductive type, wherein the body region is stacked under and connected beneath the upper surface in the vertical direction; a gate, which is formed on substrate, wherein at least part of the gate is stacked on and connected to the upper surface, wherein the PN junction is located right below the gate from a cross section view, and extends substantially perpendicular to a channel direction from a top view, wherein the gate overlays at least part of the PN junction from the top view; a source, which is formed in the substrate, and has the second conductive type, wherein the source is stacked under and connected beneath the upper surface in the vertical direction, and the source is located in the body region from the top view; a drain, which is formed in the substrate, and has the second conductive type, wherein the drain is stacked under and connected beneath the upper surface in the vertical direction, wherein the source and the drain are located at different sides of the PN junction, and the drain is separated from the gate by the high voltage well from the top view; a first buried region, which is formed in the substrate, and has the first conductive type, wherein the first buried region has a first inner boundary which is an edge of the first buried region that is closest to the gate in the channel direction, wherein the first inner boundary is located between the drain and the PN junction in the channel direction, and the first buried region is not located right below the source; and a second buried region, which is formed in the substrate, and has the second conductive type, wherein the second buried region is connected to the high voltage well, wherein the second buried region has a second inner boundary which is an edge of the second buried region that is closest to the gate in the channel direction, wherein the second buried region is not located right below the source; wherein an impurity concentration of the second conductive type of the second buried region and an impurity concentration of the second conductive type of the high voltage well are above a first predetermined level which is sufficient to prevent the PN junction and the drain from being completely depleted in an ON operation of the high-side power device.

From another perspective, the present invention provides a manufacturing method of a high-side power device, comprising: providing a substrate with a first conductive type, which includes a upper surface and a lower surface opposite to the upper surface in a vertical direction; forming a high voltage well with the second conductive type in the substrate; forming a body region with the first conductive type in the substrate, wherein the body region is stacked under and connected beneath the upper surface in the vertical direction, wherein a PN junction is formed between the body region and the high voltage well; forming a gate on substrate, wherein at least part of the gate is stacked on and connected to the upper surface, wherein a PN junction is formed between the body region and the high voltage well, wherein the PN junction is located right below the gate from a cross section view, and extends substantially perpendicular to a channel direction from a top view, wherein the gate overlays at least part of the PN junction from the top view; forming a source with the second conductive type in the substrate, wherein the source is stacked under and connected beneath the upper surface in the vertical direction, and the source is located in the body region from the top view; forming a drain with the second conductive type in the substrate, wherein the drain is stacked under and connected beneath the upper surface in the vertical direction, wherein the source and the drain are located at different sides of the PN junction, and the drain is separated from the gate by the high voltage well from the top view; forming a first buried region with the first conductive type in the substrate, wherein the first buried region has a first inner boundary which is an edge of the first buried region that is closest to the gate in the channel direction, wherein the first inner boundary is located between the drain and the PN junction in the channel direction, and the first buried region is not located right below the source; and forming a second buried region with the second conductive type in the substrate, wherein the second buried region is connected to the high voltage well, wherein the second buried region has a second inner boundary which is an edge of the second buried region that is closest to the gate in the channel direction, wherein the second buried region is not located right below the source; wherein an impurity concentration of the second conductive type of the second buried region and an impurity concentration of the second conductive type of the high voltage well are above a first predetermined level which is sufficient to prevent the high voltage well between the PN junction and the drain from being completely depleted in an ON operation of the high-side power device.

In one preferable embodiment, an impurity concentration of the first conductive type of the first buried region and the impurity concentration of the second conductive type of the high voltage well are below a second predetermined level such that the high voltage well between the PN junction and the drain is completely depleted in an OFF operation of the high-side power device.

In one preferable embodiment, the high-side power device further comprises a connection region with the first conductive type, which is stacked on and contacting the first buried region in the vertical direction, wherein the connection region is for electrically connecting the first buried region, and the first buried region is electrically connected to the body region.

In one preferable embodiment, the high-side power device further comprises a contact region with the first conductive type in the epitaxial layer, wherein the contact region is stacked under and connected beneath the epitaxial surface in the vertical direction, and the contact region is located in the body region from the top view.

In the aforementioned embodiment, the connection region is preferably located outside an operation region in the channel direction or in a width direction which is perpendicular to the channel direction.

In one preferable embodiment, a distance between the PN junction and the drain in the channel direction is a draft length, and a length between the second inner boundary and the drain in the channel direction is longer than a quarter of the drift length.

In one preferable embodiment, the first inner boundary is not located between the second inner boundary and the PN junction in the channel direction.

In one preferable embodiment, the high-side power device further comprises a drift oxide region on the epitaxial layer, wherein the drift oxide region is stacked on and connected to the high voltage well in the vertical direction, wherein part of the gate overlays the drift oxide region, wherein the drift oxide region is located between the PN junction and the drain in the channel direction.

The objectives, technical details, features, and effects of the present invention will be better understood with regard to the detailed description of the embodiments below.

BRIEF DESCRIPTION OF THE DRAWINGS

FIGS. 6A to 6L show a fifth embodiment of the present invention.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
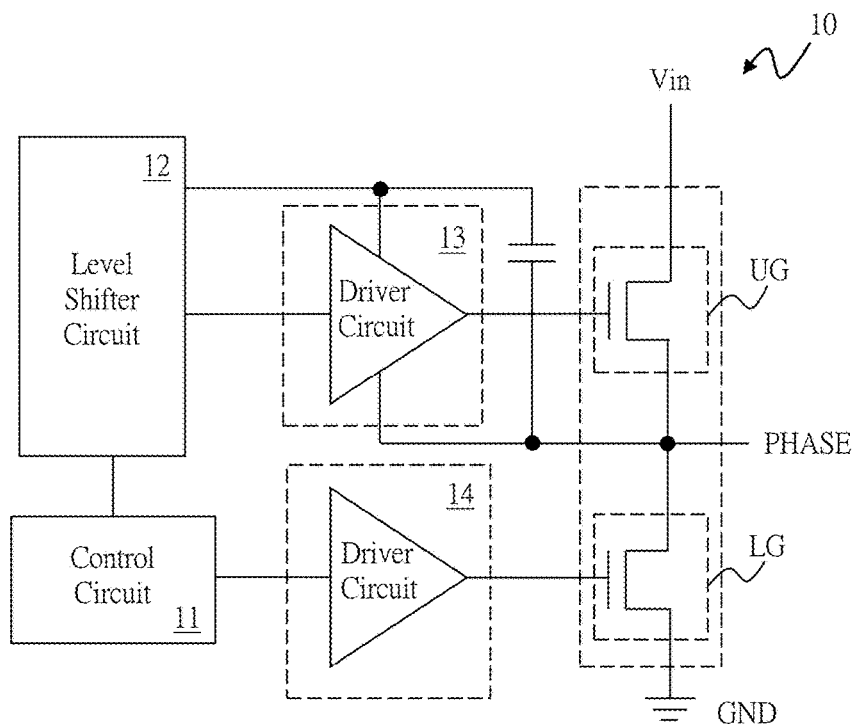
FIG. 1A shows a schematic diagram of a prior art switching regulator 10.
Figure 1B:
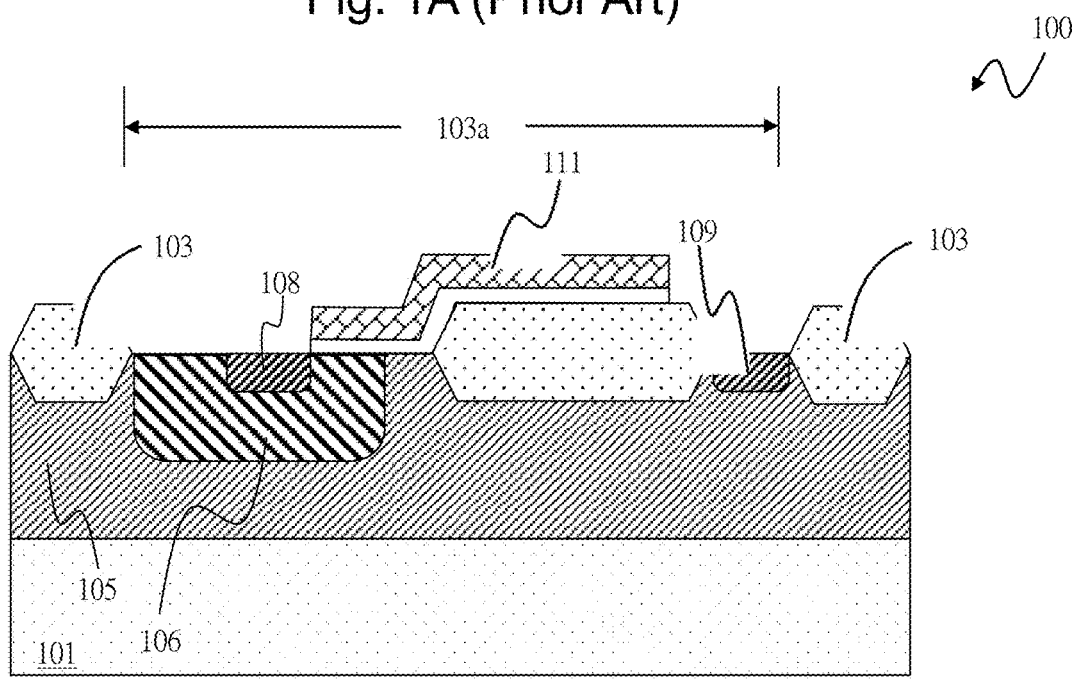
FIG. 1B shows a schematic diagram of the high-side device 100.
Figure 2A:
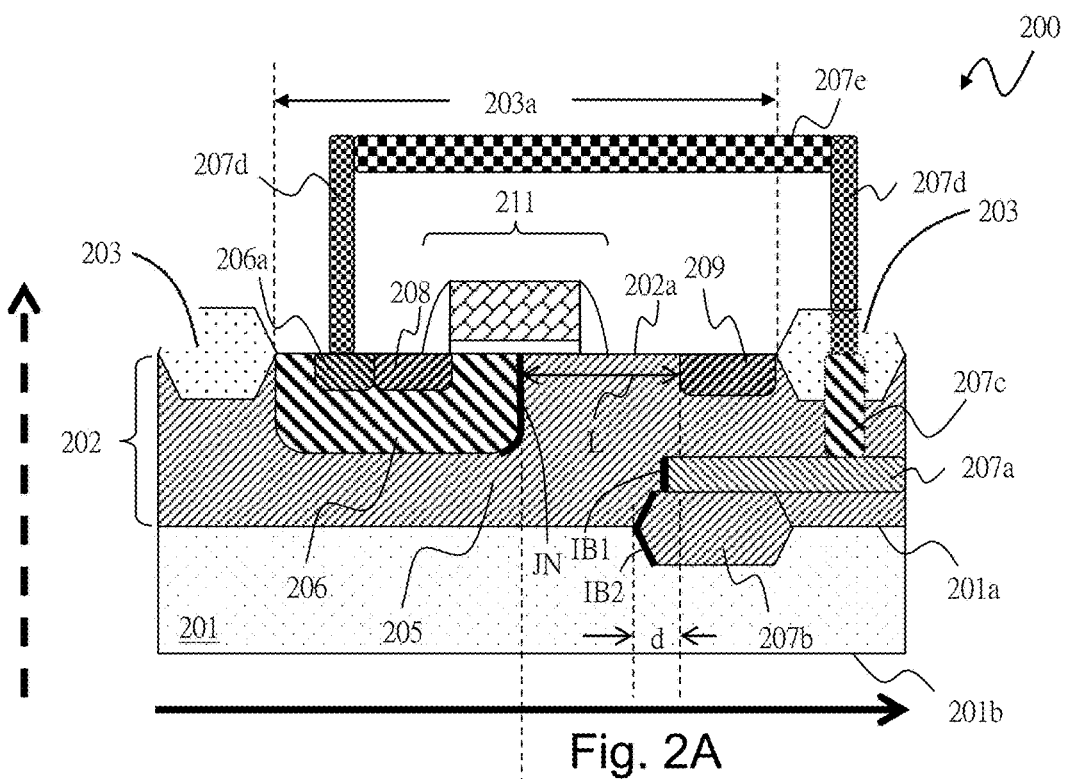
FIGS. 2A and 2B show a first embodiment of the present invention.
Figure 2B:
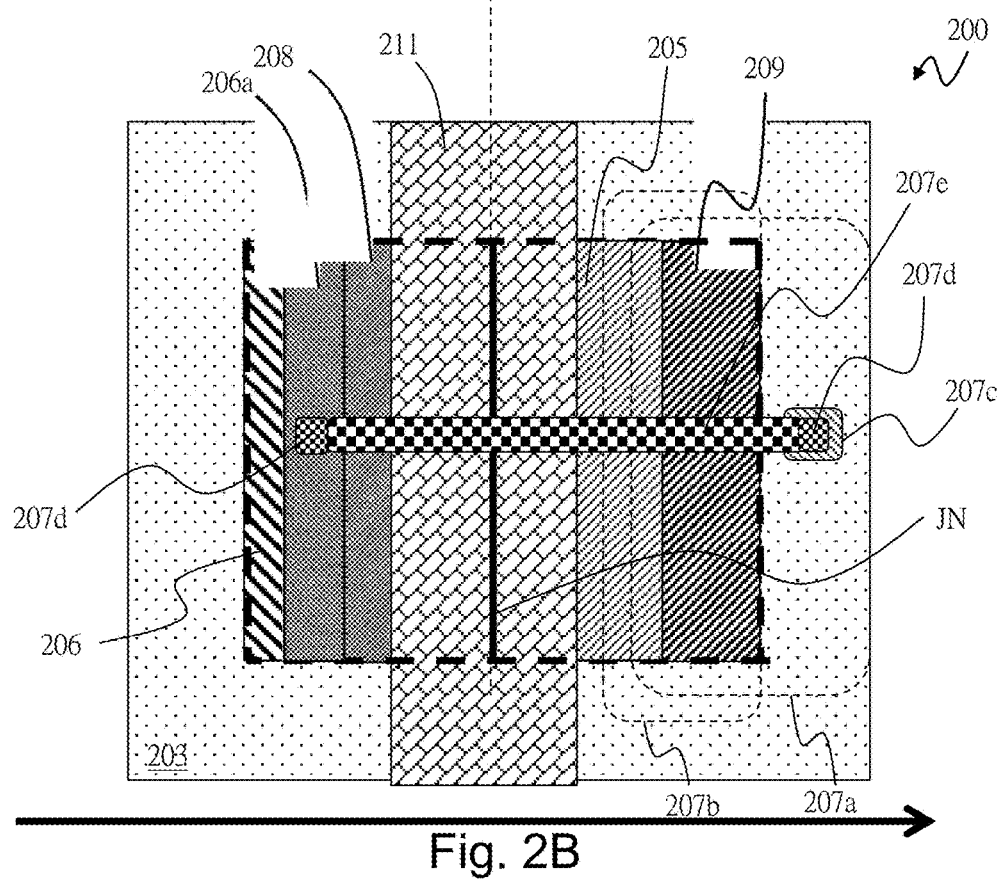

Please refer to FIGS. 2A and 2B for a first embodiment according to the present invention. FIG. 2A shows a schematic diagram of a cross-section view of a high-side power device 200 according to the present invention, and FIG. 2B shows a schematic diagram of a top view of the high-side power device 200. As show in FIG. 2A, the high-side power device 200 includes: a substrate 201, an epitaxial layer 202, an isolation oxide region 203, a high voltage well 205, a body region 206, a contact region 206a, a first buried region 207a, a second buried region 207b, a connection region 207c, a contact plug 207d, a conductive layer 207e, a source 208, a drain 209, and a gate 211.

The substrate 201 has a first conductive type which is for example but not limited to P-type. The substrate 201 has an upper surface 201a and a lower surface 201b opposite to the upper surface 201a in a vertical direction (as indicated by a bold dashed arrow shown in the figure). The epitaxial layer 202 is formed on the substrate 201 by an epitaxial process step. The epitaxial layer 202 has an epitaxial surface 202a opposite to the upper surface 201a, and the epitaxial layer 202 is stacked on and connected to the upper surface 201a in the vertical direction. The isolation oxide region 203 is for example but not limited to a local oxidation of silicon (LOCOS) structure, for defining an operation region 203a as a major region of the high-side power device 200 to operate. The body region 206, the source 208, and the gain 209 are all in the operation region 203a from the cross-section view shown in FIG. 2A and the top view shown in FIG. 2B. The high voltage well 205 is formed in the epitaxial layer 202, and has a second conductive type, for example but not limited to N-type. The high voltage well 205 is stacked on and connected to the upper surface 201a of the substrate 201 in the vertical direction.

The body region 206 is formed in the epitaxial layer 202, and has the first conductive type, for example but not limited to the P-type. The body region 206 is stacked under and connected beneath the epitaxial surface 202a in the vertical direction. A PN junction JN is formed between the body region 206 and the high voltage well 205 in the channel direction (as indicated by a bold solid arrow shown in FIGS. 2A and 2B). The gate 211 is formed in the epitaxial layer 202, and the gate 211 is stacked on and connected to the epitaxial layer surface 202a in the vertical direction. As shown in the cross-section view FIG. 2A, the PN junction JN is located right below the gate 211, and as shown in the top-view FIG. 2B, the PN junction JN extends substantially perpendicular to the channel direction. The gate 211 overlays at least part of the PN junction JN from the top-view FIG. 2B; that is, the PN junction JN can extend longer or shorter than the gate 211 in a width direction (the direction of the dashed arrow in FIG. 9). In this embodiment, the gate 211 for example covers all of the PN junction JN; that is, the PN junction JN extends by the same length as the gate 211. The source 208 is formed in the epitaxial layer 202, and has the second conductive type, which is for example but not limited to the N-type. The source 208 is stacked under and connected beneath the epitaxial surface 202a in the vertical direction. From cross-section view FIG. 2A and top-view FIG. 2B, the source 208 is located in the body region 206. The drain 209 is formed in the epitaxial layer 202, and has the second conductive type, which is for example but not limited to the N-type. The drain 209 is stacked under and connected beneath the epitaxial surface 202a in the vertical direction. The source 208 and the drain 209 are located at different sides of the PN junction JN. The drain 209 and the gate 211 are separated by the high voltage well 205 from the cross-section view FIG. 2A and the top-view FIG. 2B.

The contact region 206a has the first conductive type, for example but not limited to the P-type, and the contact region 206a is stacked under and connected beneath the epitaxial surface 202a. As shown in cross-section view FIG. 2A and top view FIG. 2B, the contact region 206a is located in the body region 206. The first buried region 207a is formed in the epitaxial layer 202, and has the first conductive type, for example but not limited to the P-type. The first buried region 207a has a first inner boundary IB1 which is an edge of the first buried region 207a that is closest to the gate 211 in the channel direction; the first inner boundary IB1 is located between the drain 209 and the PN junction JN in the channel direction, and the first buried region 207a is not located right below the source 208. The second buried region 207b is formed in the substrate 201 and the epitaxial layer 202, and has the second conductive type, for example but not limited to the N-type. Part of the second buried region 207b (for example a lower part of the second buried region 207b in this embodiment) is located in the substrate 201, and another part of the second buried region 207b (for example an upper part of the second buried region 207b in this embodiment) is located in the epitaxial layer 202, wherein the upper part of the second buried region 207b is connected to the high voltage well 205. The second buried region 207b has a second inner boundary IB2 which is an edge of the second buried region 207b that is closest to the gate 211 in the channel direction. The second inner boundary IB2 of the second buried region 207b is located right below a region which is between the drain 209 and the PN junction JN in the channel direction, and the second buried region 207b is not located right below the source 208. An impurity concentration of the second conductive type (N-type) of the second buried region 207b and an impurity concentration of the second conductive (N-type) of the high voltage well 205 are above a first predetermined level to prevent the high voltage well 205 between the PN junction PN and the drain 209 from being completely depleted when the high-side power device 200 operates in an ON operation.

Preferably, in the high-side power device 200, an impurity concentration of the first conductive type of the first buried region 207a and an impurity concentration of the second conductive type of the high voltage well 205 are below a second predetermined level, such that the high voltage well 205 between the PN junction JN and the drain 209 are completely depleted when the high-side power device 200 operates in an OFF operation, to increase breakdown voltage.

In one embodiment, as shown in the figure, the high-side power device 200 further includes the connection region 207c, which has the first conductive type, for example but not limited to the P-type. The connection region 207c is stacked on and contacting the first buried region 207a in the vertical direction, for electrically connecting the first buried region 207a. The first buried region 207a and the body region 206 are electrically connected with each other via the connection region 207c, the contact plug 207d, the conductive layer 207e, and the contact region 206a. The connection region 207c is formed by a same process step which forms a P-type well of another transistor device in the substrate 201. The contact plug 207d and the conductive layer 207e may be formed by process steps of depositing, etching, and/or chemical mechanical polishing (CMP) metal or other conductive materials, as well known by those skilled in the art, so details thereof are omitted here.

The term "operation region" (203a) indicates a region where a current or charged particles are formed and/or moved by applying a voltage or an electric field when the high-side power device 200 operates, as well known by those skilled in the art, so details thereof are omitted here.

In addition, in one preferable embodiment, a distance between the PN junction JN and the drain 209 in the channel direction is defined as a drift length L, as shown in FIG. 2A, and a length d between the second inner boundary IB2 and the drain 209 in the channel direction is longer than a quarter of the drift length L. in addition, as shown in the figure, the connection region 207*c* is located outside the operation region 203*a* in the channel direction. In addition, the first inner boundary IB1 is not located between the second inner boundary IB2 and the PN junction JN in the channel direction, i.e., the first inner boundary IB1 is located outside a region between the second inner boundary IB2 and PN junction JN. In other words, in a preferable embodiment, the first inner boundary IB1 is farther from the PN junction JN compared to the second inner boundary IB2.

Figure 3A:
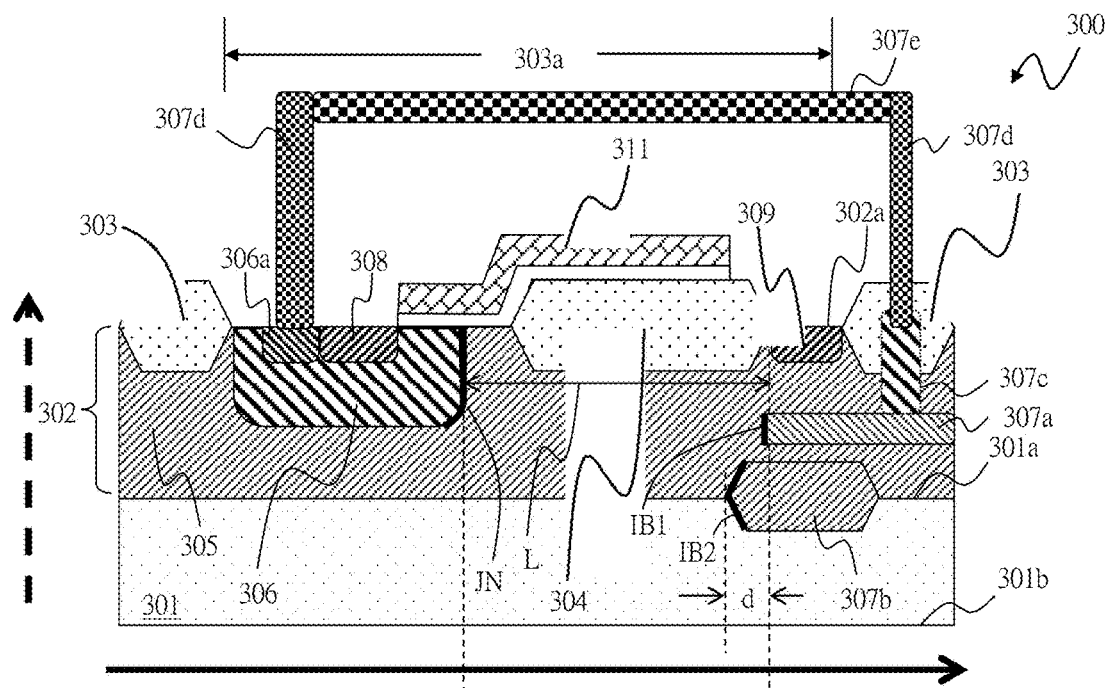
FIGS. 3A and 3B show a second embodiment of the present invention.
Figure 3B:
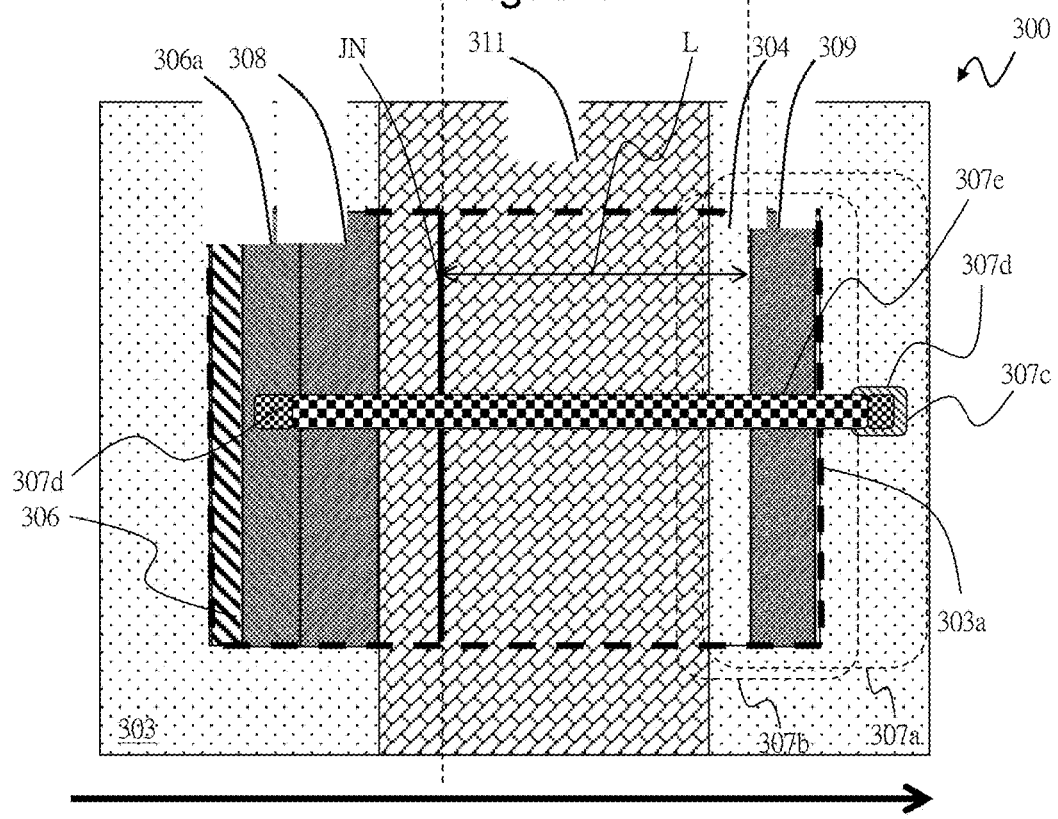

Please refer to FIGS. 3A and 3B for a second embodiment according to the present invention. FIG. 3A shows a cross-section view of a high-side power device 300 according to the present invention. FIG. 3B shows a top-view of the high-side power device 300 according to the present invention. As shown in FIG. 3A, the high-side power device 300 includes: a substrate 301, an epitaxial layer 302, an isolation oxide region 303, a drift oxide region 304, a high voltage well 305, a body region 306, a contact region 306*a*, a first buried region 307*a*, a second buried region 307*b*, a connection region 307*c*, a contact plug 307*d*, a conductive layer 307*e*, a source 308, a drain 309, and the gate 311.

The substrate 301 has the first conductive type which is for example but not limited to the P-type. The substrate 301 has an upper surface 301*a* and a lower surface 301*b* opposite to the upper surface 301*a* in the vertical direction (indicated by bold dashed arrows shown in the figure). The epitaxial layer 302 is formed on the substrate 301 by an epitaxial process step. The epitaxial layer 302 is stacked on and connected to the upper surface 301*a* in the vertical direction. The isolation oxide region 303 is for example but not limited to the local oxidation of silicon (LOCOS) structure, for defining an operation region 303*a* as a major region of the high-side power device 300 to operate. The body region 306, the source 308, and the drain 309 are all in the operation region 303*a* from the cross-section view shown in FIG. 3A and the top view shown in FIG. 3B. The high voltage well 305 is formed in the epitaxial layer 302, and has the second conductive type, for example but not limited to the N-type. The high voltage well 305 is stacked on and connected to the upper surface 301*a* of the substrate 301 in the vertical direction.

The body region 306 is formed in the epitaxial layer 302, and has the first conductive type, for example but not limited to the P-type. The body region 306 is stacked under and connected beneath the epitaxial surface 302*a* in the vertical direction. A PN junction JN is formed between the body region 306 and the high voltage well 305 in the channel direction (as indicated by a bold solid arrow shown in FIGS. 3A and 3B). The gate 311 is formed on the epitaxial layer 302, and the gate 311 is stacked on and connected to the epitaxial layer surface 302*a* in the vertical direction. As shown in the cross-section view FIG. 3A, the PN junction JN is located right below the gate 311, and as shown in the top-view FIG. 3B, the PN junction JN is substantially perpendicular to the channel direction. The gate 311 overlays at least part of the PN junction JN from the top-view FIG. 3B; that is, the PN junction JN can extend longer or shorter than the gate 311. In this embodiment, the gate 311 for example covers all of the PN junction JN. The source 308 is formed in the epitaxial layer 302, and has the second conductive type, for example but not limited to the N-type. The source 308 is stacked under and connected beneath the epitaxial surface 302*a* in the vertical direction. From cross-section view FIG. 3A and top-view FIG. 3B, the source 308 is located in the body region 306. The drain 309 is formed in the epitaxial layer 302, and has the second conductive type, for example but not limited to the N-type. The drain 309 is stacked under and connected beneath the epitaxial surface 302*a* in the vertical direction. The source 308 and the drain 309 are located at different sides of the PN junction JN. The drain 309 and the gate 311 are separated by the high voltage well 305 from the cross-section view FIG. 3A and the top-view FIG. 3B.

The contact region 306*a* is formed in the epitaxial layer 302, and has the first conductive type, for example but not limited to the P-type, and the contact region 306*a* is stacked under and connected beneath the epitaxial surface 302*a*. As shown in the cross-section view FIG. 3A and the top view FIG. 3B, the contact region 306*a* is located in the body region 306. The first buried region 307*a* is formed in the epitaxial layer 302, and has the first conductive type, for example but not limited to the P-type. The first buried region 307*a* has a first inner boundary IB1 which is an edge of the first buried region 307*a* that is closest to the gate 311 in the channel direction; the first inner boundary IB1 is located between the drain 309 and the PN junction JN in the channel direction, and the first buried region 307*a* is not located right below the source 308. The second buried region 307*b* is formed in the substrate 301 and the epitaxial layer 302, and has the second conductive type, for example but not limited to the N-type. Part of the second buried region 307*b* (for example a lower part of the second buried region 307*b* in this embodiment) is located in the substrate 301, and another part of the second buried region 307*b* (for example an upper part of the second buried region 307*b* in this embodiment) is located in the epitaxial layer 302, wherein the upper part of the second buried region 307*b* is connected to the high voltage well 305. The has a second inner boundary IB2, which is an edge of the second buried region 307*b* that is closest to the gate 311 in the channel direction; the second buried region 307*b* is located right below a region which is between the drain 309 and the PN junction JN in the channel direction, and the second buried 307*b* is not located right below the source 308. An impurity concentration of the second conductive type (N-type) of the second buried region 307*b* and an impurity concentration of the second conductive (N-type) of the high voltage well 305 are high enough (i.e., above a predetermined level) to prevent the high voltage well 305 between the PN junction PN and the drain 309 from being completely depleted when the high-side power device 300 operates in an ON operation.

In the high-side power device 300, an impurity concentration of the first conductive type of the first buried region 307*a* and an impurity concentration of the second conductive type of the high voltage well 305 are low enough (i.e., below another predetermined level), such that the high voltage well 305 between the PN junction JN and the drain 309 are completely depleted when the high-side power device 300 operates in an OFF operation, to increase breakdown voltage.

In one embodiment, as shown in the figure, the high-side power device 300 further includes the connection region 307*c*, which has the first conductive type, for example but not limited to the P-type. The connection region 307*c* is stacked on and contacting the first buried region 307*a* in the vertical direction for electrically connecting the first buried region 307a. The first buried region 307a and the body region 306 are electrically connected with each other via the connection region 307c, the contact plug 307d, the conductive layer 307e, and the contact region 306a. The connection region 307c is formed by a same process step which forms a P-type well of another device in the substrate 301. The contact plug 307d and the conductive layer 307e may be formed by process steps of depositing, etching, and/or chemical mechanical polishing (CMP) with metal or other conductive materials, as well known by those skilled in the art, so details thereof are omitted here.

The term "operation region" (303a) indicates a region where a current or charged particles are formed and/or moved by applying a voltage or an electric field when the high-side power device 300 operates, as well known by those skilled in the art, so details thereof are omitted here.

In addition, in one preferable embodiment, a distance between the PN junction JN and the drain 309 in the channel direction is defined as a drift length L, as shown in FIG. 3A, and a length d between the second inner boundary IB2 and the drain 309 in the channel direction is longer than a quarter of the drift length L. In addition, as shown the figure, the connection region 307c is located outside the operation region 303a in the channel direction. In addition, the first inner boundary IB1 is not located between the second inner boundary IB2 and the PN junction JN in the channel direction, i.e., the first inner boundary IB1 is located outside a region between the second inner boundary IB2 and PN junction JN. In other words, in a preferable embodiment, the first inner boundary IB1 is farther from the PN junction JN compared to the second inner boundary IB2.

The drift oxide region 304 is formed in the operation region 303a on the epitaxial layer 302, and the drift oxide region 304 is stacked on and connected to the high voltage well 305 in the vertical direction region. The drift oxide region 304 is located between the PN junction JN and the drain 309 in the channel direction.

Figure 4A:
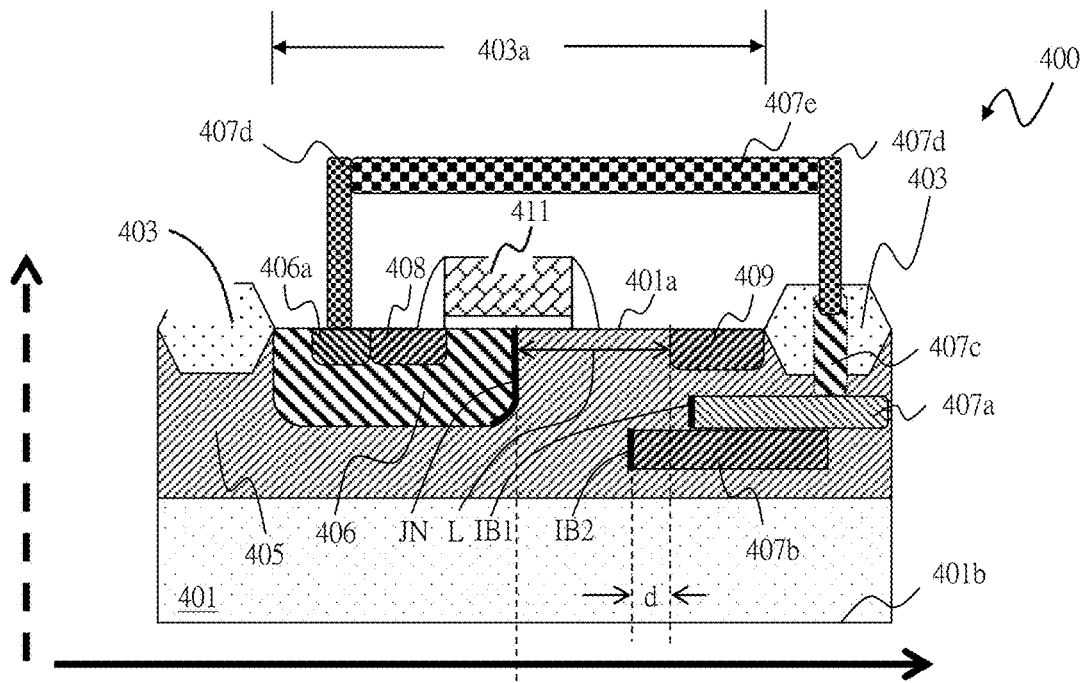
FIGS. 4A and 4B show a third embodiment of the present invention.
Figure 4B:
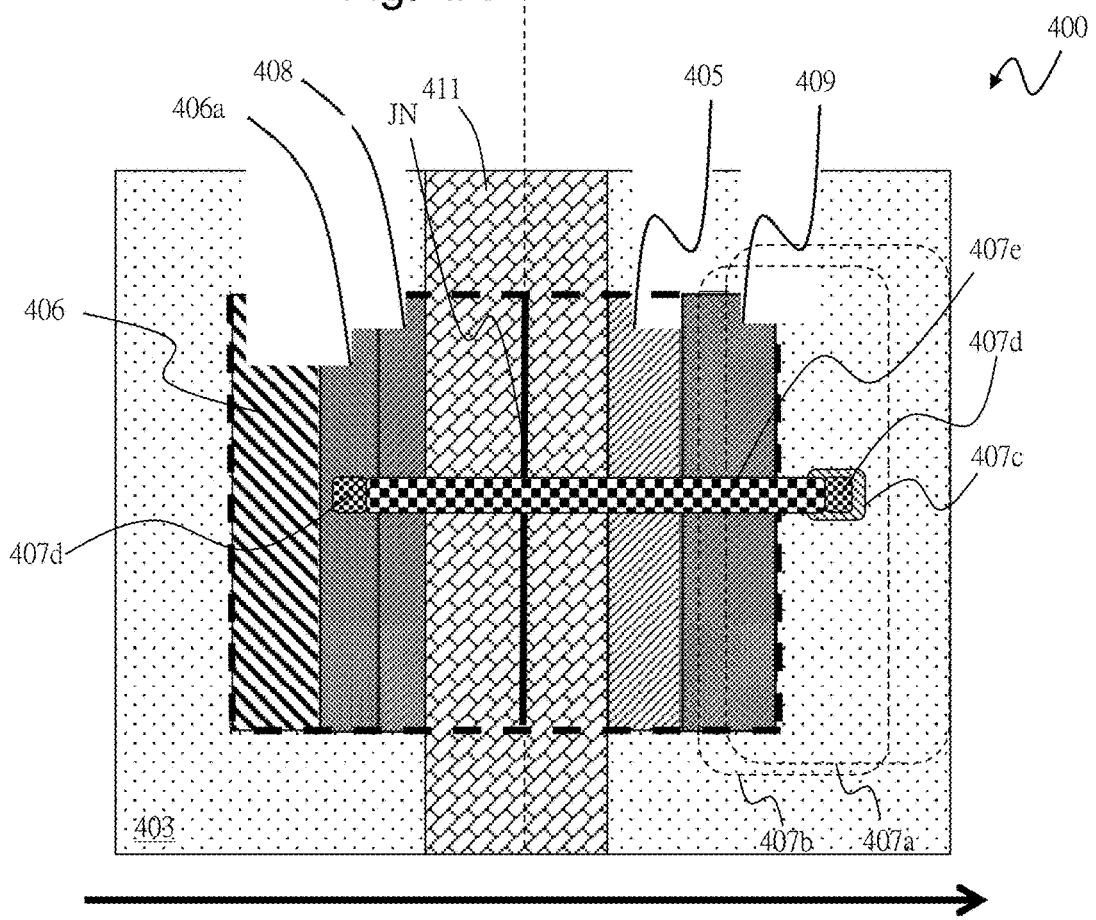

Please refer to FIGS. 4A and 4B for a third embodiment according to the present invention. FIG. 4A shows a cross-section view of a high-side power device 400 according to the present invention. FIG. 4B shows a top-view of the high-side power device 400 according to the present invention. As shown in FIG. 4A, the high-side power device 400 includes: a substrate 401, an epitaxial layer 402, an isolation oxide region 403, a high voltage well 405, a body region 406, a contact region 406a, a first buried region 407a, a second buried region 407b, a connection region 407c, a contact plug 407d, a conductive layer 407e, a source 408, a drain 409, and a gate 411.

The substrate 401 has the first conductive type which is for example but not limited to the P-type. The substrate 401 has an upper surface 401a and a lower surface 401b opposite to the upper surface 401a in the vertical direction (indicated by bold dashed arrows shown in the figure). The isolation oxide region 403 is for example but not limited to the local oxidation of silicon (LOCOS) structure, for defining an operation region 403a as a major region of the high-side power device 400 to operate. The body region 406, the source 408, and the gain 409 are all in the operation region 403a from the cross-section view shown in FIG. 4A and the top view shown in FIG. 4B. The high voltage well 405 is formed in the substrate 401, and has the second conductive type, for example but not limited to the N-type.

The body region 406 is formed in the substrate 401, and has the first conductive type, for example but not limited to the P-type. The body region 406 is stacked under and connected beneath upper surface 401a in the vertical direction. A PN junction JN is formed between the body region 406 and the high voltage well 405 in the channel direction as indicated by a bold solid arrow shown in FIGS. 4A and 4B. The gate 411 is formed on the substrate 401, and the gate 411 is stacked on and connected to the upper surface 401a in the vertical direction. As shown in the cross-section view FIG. 4A, the PN junction JN is located right below the gate 411, and as shown in the top-view FIG. 4B, the PN junction JN is substantially perpendicular to the channel direction. The gate 411 overlays at least part of the PN junction JN from the top-view FIG. 4B; that is, the PN junction JN can extend longer or shorter than the gate 411. In this embodiment, the gate 411 for example covers all of the PN junction JN. The source 408 is formed in the body region 406, and has the second conductive type, for example but not limited to the N-type. The source 408 is stacked under and connected beneath upper surface 401a in the vertical direction. From the cross-section view FIG. 4A and the top-view FIG. 4B, the source 408 is located in the body regionregion 406. The drain 409 is formed in the substrate 401, and has the second conductive type, for example but not limited to the N-type. The drain 409 is stacked under and connected beneath upper surface 401a in the vertical direction. The source 408 and the drain 409 are located at different sides of the PN junction JN. The drain 409 and the gate 411 are separated by the high voltage well 405 from the cross-section view FIG. 4A and the top-view FIG. 4B.

The contact region 406a is formed in the substrate 401, and has the first conductive type, for example but not limited to the P-type, and the contact region 406a is stacked under and connected beneath the upper surface 401a vertical direction. As shown in the cross-section view FIG. 4A and the top view FIG. 4B, the contact region 406a is located in the body region 406. The first buried region 407a is formed in the substrate 401, and has the first conductive type, for example but not limited to the P-type. The first buried region 407a has a first inner boundary IB1 which is an edge of the first buried region 407a that is closest to the gate 411 in the channel direction; the first inner boundary IB1 is located between the drain 409 and the PN junction JN in the channel direction, and the first buried region 407a is not located right below the source 408. The second buried region 407b is formed in the substrate 401, and has the second conductive type, for example but not limited to the N-type. The second buried region 407b has an inner boundary IB2 which is an edge of the second buried region 407b that is closest to the gate 411 in the channel direction, as shown in the FIG. 4A. The second buried region 407b is located right below a region which is between the drain 409 and PN junction JN in the channel direction, and the second buried region 407b is not located right below in the source 408. An impurity concentration of the second conductive type (N-type) of the second buried region 407b and an impurity concentration of the second conductive (N-type) of the high voltage well 405 are high enough (i.e., above a predetermined level) to prevent the high voltage well 405 between the PN junction PN and the drain 409 from being completely depleted when the high-side power device 400 operates in an ON operation.

In the high-side power device 400, an impurity concentration of the first conductive type of the first buried region 407a and an impurity concentration of the second conductive type of the high voltage well 405 are low enough (i.e., below another predetermined level), such that the high voltage well 405 between the PN junction JN and the drain 409 are completely depleted when the high-side power device 400 operates in an OFF operation, to increase breakdown voltage.

In one embodiment, as shown in the figure, the high-side power device 400 further includes the connection region 407c, which has the first conductive type, for example but not limited to the P-type. The connection region 407c is stacked on and contacting the first buried region 407a in the vertical direction, for electrically connecting the first buried region 407a. The first buried region 407a and the body region 406 are electrically connected with each other via the connection region 407c, the contact plug 407d, the conductive layer 407e, and the contact region 406a. The connection region 407c is formed by a same process step which forms a P-type well of another transistor device in the substrate 401. The contact plug 407d and the conductive layer 407e maybe formed by process steps of depositing, etching, and/or chemical mechanical polishing (CMP) with metal or other conductive materials, as well known by those skilled in the art, so details thereof are omitted here.

The term "operation region" (403a) indicates a region where a current or charged particles are formed and/or moved by applying a voltage or an electric field when the high-side power device 400 operates, as well known by those skilled in the art, so details thereof are omitted here.

In addition, in one preferable embodiment, a distance between the PN junction JN and the drain 409 in the channel direction is defined as a drift length L, as shown in FIG. 4A, and a length d between the second inner boundary IB2 and the drain 409 in the channel direction is longer than a quarter of the drift length L. In addition, as shown the figure, the connection region 407c is located outside the operation region 403a in the channel direction. In addition, the first inner boundary IB1 is not located between the second inner boundary IB2 and the PN junction JN in the channel direction, i.e., the first inner boundary IB1 is located outside a region between the second inner boundary IB2 and PN junction JN. In other words, in a preferable embodiment, the first inner boundary IB1 is farther from the PN junction JN compared to the second inner boundary IB2.

Figure 5A:
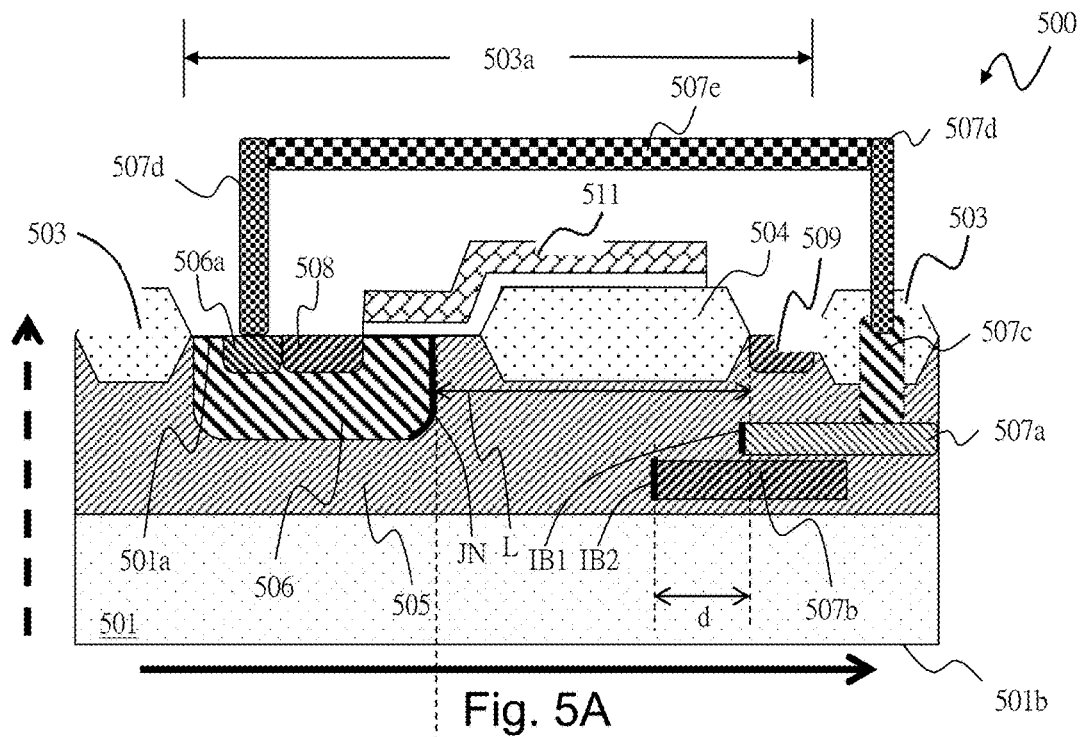
FIGS. 5A and 5B show a fourth embodiment of the present invention.
Figure 5B:
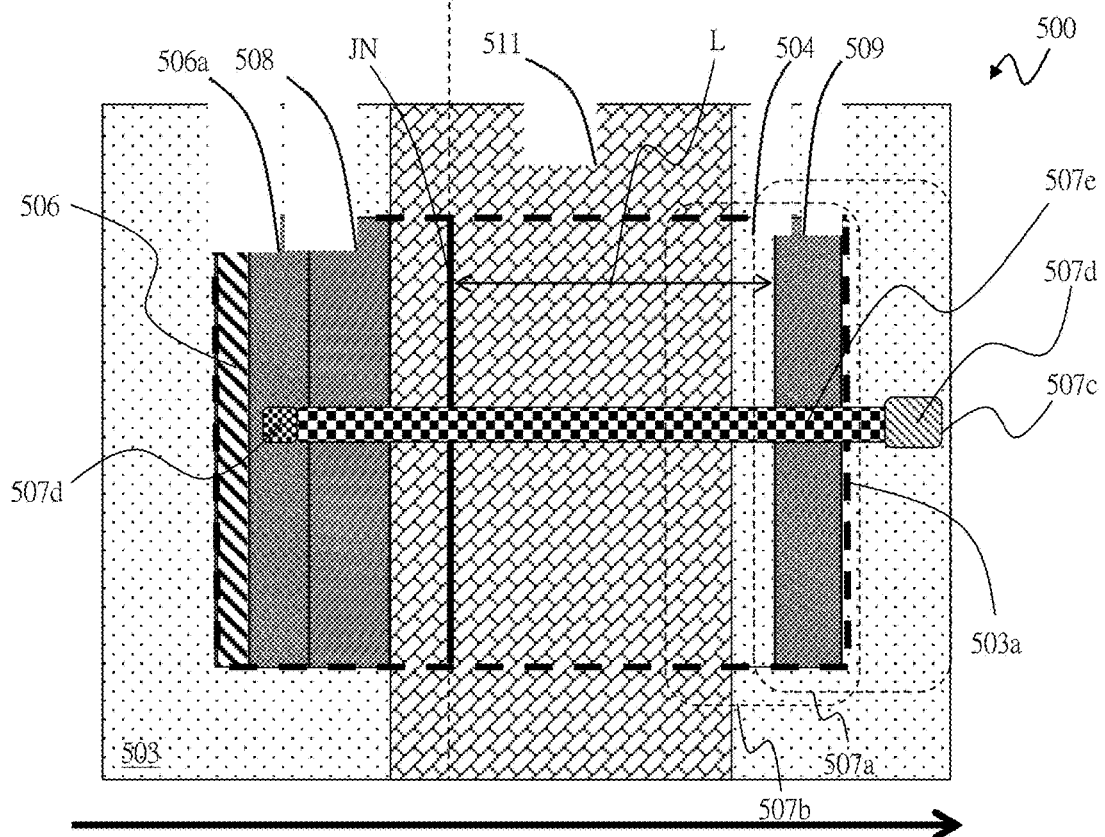

Please refer to FIGS. 5A and 5B for a fourth embodiment according to the present invention. FIG. 5A shows a cross-section view of a high-side power device 500 according to the present invention. FIG. 5B shows a top-view of the high-side power device 500 according to the present invention. As shown in FIG. 5A, the high-side power device 500 include: a substrate 501, an isolation oxide region 503, a drift oxide region 504, a high voltage well 505, a body region 506, a contact region 506a, a first buried region 507a, a second buried region 507b, a connection region 507c, a contact plug 507d, a conductive layer 507e, *a source* 508, *a drain* 509, *and a gate* 511.

The substrate 501 has the first conductive type which is for example but not limited to the P-type. The substrate 501 has an upper surface 501a and a lower surface 501b opposite to the upper surface 501a in the vertical direction (indicated by bold dashed arrows shown in the figure). The isolation oxide region 503 is for example but not limited to the local oxidation of silicon (LOCOS) structure, for defining an operation region 503a as a major region of the high-side power device 500 to operate. The body region 506, the source 508, and the gain 509 are all in the operation region 503a from the cross-section view FIG. 5A and the top view FIG. 5B. The high voltage well 505 is formed in the substrate 501, and has the second conductive type, for example but not limited to the N-type.

The body region 506 is formed in the substrate 501, and has the first conductive type, for example but not limited to the P-type. The body region 506 is stacked under and connected beneath upper surface 501a in the vertical direction. A PN junction JN is formed between the body region 506 and the high voltage well 505 in the channel direction as indicated by a bold solid arrow shown in FIGS. 5A and 5B. The gate 511 is formed on the substrate 501, and the gate 511 is stacked on and connected to the upper surface 501a in the vertical direction. As shown in the cross-section view FIG. 5A, the PN junction JN is located right below the gate 511, and as shown in the top-view FIG. 5B, the PN junction JN is substantially perpendicular to the channel direction. The gate 511 overlays at least part of the PN junction JN from the top-view FIG. 5B; that is, the PN junction JN can extend longer or shorter than the gate 511. In this embodiment, the gate 511 for example covers all of the PN junction JN. The source 508 is formed in the body region 506, and has the second conductive type, for example but not limited to the N-type. The source 508 is stacked under and connected beneath upper surface 501a in the vertical direction. From the cross-section view FIG. 5A and the top-view FIG. 5B, the source 508 is located in the body region 506. The drain 509 is formed in the substrate 501, and has the second conductive type, for example but not limited to the N-type. The drain 509 is stacked under and connected beneath upper surface 501a in the vertical direction. The source 508 and the drain 509 are located at different sides of the PN junction JN. The drain 509 and the gate 511 are separated by the high voltage well 505 from the cross-section view FIG. 5A and the top-view FIG. 5B.

The contact region 506a is formed in the substrate 501, and has the first conductive type, for example but not limited to the P-type, and the contact region 506a is stacked under and connected beneath the upper surface 501a vertical direction. As shown in the cross-section view FIG. 5A and top view FIG. 5B, the contact region 506a is located in the body region 506. The first buried region 507a is formed in the substrate 501, and has the first conductive type, for example but not limited to the P-type. The first buried region 507a has a first inner boundary IB1 which is an edge of the first buried region 507a that is closest to the gate 511 in the channel direction; the first inner boundary IB1 is located between the drain 509 and the PN junction JN in the channel direction, and the first buried region 507a is not located right below the source 508. The second buried region 507b is formed in the substrate 501, and has the second conductive type, for example but not limited to the N-type. The second buried region 507b has an inner boundary IB2 which is an edge of the second buried region 507b that is closest to the gate 511 in the channel direction, as shown in FIG. 5A. The second buried region 507b is located right below a region which is between the drain 509 and PN junction JN in the channel direction, and the second buried region 507b is not located right below in the source 508. An impurity concentration of the second conductive type (N-type) of the second buried region 507b and an impurity concentration of the second conductive (N-type) of the high voltage well 505 are high enough (i.e., above a predetermined level) to prevent the high voltage well 505 between the PN junction PN and the drain 509 from being completely depleted when the high-side power device 500 operates in an ON operation.

In the high-side power device 500, an impurity concentration of the second conductive type of the first buried region 507a and an impurity concentration of the first conductive type of the high voltage well 505 are low enough (i.e., below another predetermined level), such that the high voltage well 505 between the PN junction JN and the drain 509 are completely depleted when the high-side power device 500 operates in an OFF operation, to increase breakdown voltage.

In one embodiment, as shown in the figure, the high-side power device 500 further includes the connection region 507c, which has the first conductive type, for example but not limited to the P-type. The connection region 507c is stacked on and contacting the first buried region 507a in the vertical direction, for electrically connecting the first buried region 507a. The first buried region 507a and the body region 506 are electrically connected to each other via the connection region 507c, the contact plug 507d, the conductive layer 507e, and the contact region 506a. The connection region 507c is formed by a same process step which forms a P-type well of another device in the substrate 501. The contact plug 507d and the conductive layer 507e may be formed by process steps of depositing, etching, and/or chemical mechanical polishing (CMP) with metal or other conductive materials, as well known by those skilled in the art, so details thereof are omitted here.

The term "operation region" (503a) indicates a region where a current or charged particles are formed and/or moved by applying a voltage or an electric field when the high-side power device 500 operates, as well known by those skilled in the art, so details thereof are omitted here.

In addition, in one preferable embodiment, a distance between the PN junction JN and the drain 509 in the channel direction is defined as a drift length L, as shown in FIG. 5A, and a length d between the second inner boundary IB2 and the drain 509 in the channel direction is longer than a quarter of the drift length L. In addition, as shown the figure, the connection region 507c is located outside the operation region 503a in the channel direction. In addition, the first inner boundary IB1 is not located between the second inner boundary IB2 and the PN junction JN in the channel direction, i.e., the first inner boundary IB1 is located outside a region between the second inner boundary IB2 and PN junction JN. In other words, in a preferable embodiment, the first inner boundary IB1 is farther from the PN junction JN compared to the second inner boundary IB2.

The drift oxidation region 504 is formed in the operation region 503a on the substrate 501, and the drift oxidation region 504 is stacked on and connected to the high voltage well 505 in the vertical direction. The drift oxide region 504 is located between the PN junction JN and the drain 509 in the channel direction.

Figure 6G:
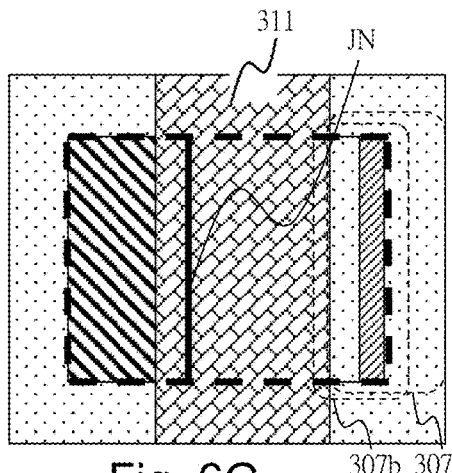

Please refer to FIGS. 6A-6L for a fifth embodiment according to the present invention. FIGS. 6A-6L show schematic diagrams of top views and cross-section views of a manufacturing method of the high-side power device 300 according to the present invention. First, the top view FIG. 6A and the cross-section view FIG. 6B show that, the substrate 301 is provided, wherein the substrate 301 is for example but not limited to a P-type silicon substrate, but the present invention is not limited to this and the substrate 301 may be another type of semiconductor substrate. The P-type substrate 301 has the upper surface 301a and the lower surface 301b opposite to the upper surface 301a in the vertical direction (as indicated by a bold solid arrow shown in FIGS. 4A and 4B). As shown in FIGS. 6A and 6B, the epitaxial layer 302 is formed on the P-type substrate 301, and has the epitaxial surface 302a opposite to the upper surface 301a in the vertical direction, wherein the epitaxial layer 302 is stacked on and connected to the upper surface 301a.

Next, the high voltage well 305 with the second conductive type, for example but not limited to the N-type, may be formed by implanting the N-type impurities with accelerated ions as indicated by dashed arrows shown in FIG. 6B of an ion implantation process, into a defined region in the epitaxial layer 302. The high voltage well 305 is stacked on and connected to the upper surface 301a on the substrate 301. Next, the first buried region 307a is formed in the epitaxial layer 302, wherein the first buried region 307a has the first conductive type, for example but not limited to the P-type. The inner first boundary IB1 of the first buried region 307a is located between the drain 307 (to be formed in a later process step) and the PN junction JN (to be formed in a later process step), and the first buried region 307a is not located right below the source 308 (to be formed in a later process step). The first buried region 307a is defined by for example but not limited to a photoresist mask formed by a lithography process step (not shown), and an ion implantation process step implants for example but not limited to the P-type impurities to the defined region in the form of accelerated ions. An implantation region of the first buried region 307a is formed in the substrate 301. Next, the photoresist mask is removed, and next, an anneal process step thermally diffuses the P-type impurities in the implantation region of the first buried region 307a, to form the first buried region 307a. Lithography, implanation and anneal process steps as well known by those skilled in the art, so details thereof are omitted here.

Next, the second buried region 307b is formed in the substrate 301 and the epitaxial layer 302, and has the second conductive type, for example but not limited to the N-type, wherein part (for example a lower part) of the second buried region 307b is located in the substrate 301, and another part (for example an upper part) the second buried region 307b is located in the epitaxial layer 302 in the vertical direction. The second inner boundary IB2 of the second buried 307b is located between the drain 309 and the PN junction JN, and the second buried region IB2 is not located right below the source 308 formed in the later process step. The second buried region 307b is defined by for example but not limited to a photoresist mask formed by a lithography process step (not shown), and an ion implantation process step implants for example but not limited to the N-type impurities to the defined region in the form of accelerated ions. An implantation region of the second buried region 307b is formed in the substrate 301. Next, the photoresist mask is removed, and next, an anneal process step thermally diffuses part of the N-type impurities in the implantation region of the second buried region 307b to the epitaxial layer 302, to form the second buried region 307b.

Next, as shown in the top view FIG. 6C and cross-section view FIG. 6D, the isolation oxide region 303 is formed on the epitaxial layer 302, for defining the operation region 303a, and the drift oxide region 304 is formed in the operation region 303a on the epitaxial layer 302 in the meantime with or right after the isolation oxide region 303, and the drift oxide region 304 is stacked on and connects the high voltage well 305 in the vertical direction. The isolation oxide region 303 and the drift oxide region 304 are for example but not limited to the LOCOS structure as shown in the figure; however in another embodiment, the isolation oxide region 303 and the drift oxide region 304 may be a shallow trench isolation (STI) structure instead.

Next, as shown in the top view FIG. 6E and cross-section view FIG. 6F, the body region 306 with the first conductive type (for example but not limited to the P-type) is formed in the epitaxial layer 302 beneath the epitaxial surface 302a, and connects the epitaxial surface 302a in the vertical direction, wherein the body region 306 and the high voltage well 305 form a PN junction JN in the channel direction as indicated by bold solid lines shown in FIGS. 6E and 6F.

Next, the body region 306 is defined by for example but not limited to a photoresist mask 306b formed by a lithography process step, and an ion implantation process step implants for example but not limited to P-type impurities to the defined region in the form of accelerated ions. An implantation region of the body region 306 is formed in the substrate 301. Next, the photoresist mask 306b is removed to form the body region 306. The PN junction JN is located right below the gate 311 (to be formed in a later process step), and the PN junction JN is substantially perpendicular to the channel direction.

Figure 6H:
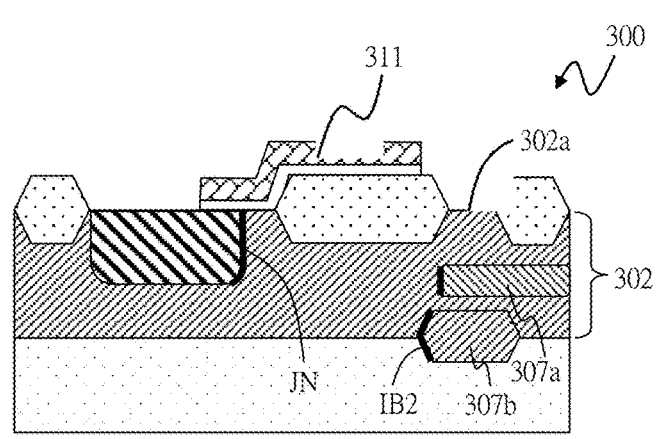

Next, as shown in the top view FIG. 6G and cross-section view FIG. 6H, the gate 311 is formed on the epitaxial layer 302, and is stacked on and connects the epitaxial surface 302a of the epitaxial layer 302 in the vertical direction, wherein the gate 311 covers at least part of the PN junction JN from the cross-section view FIG. 6H and the top view FIG. 6G (that is, the PN junction JN can extend longer or shorter than the gate 311). In this embodiment, the gate 311 covers for example but not limited to all of the PN junction JN.

Figure 6I:
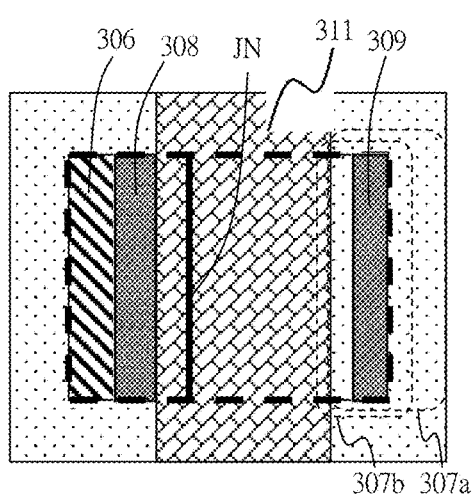
Figure 6J:
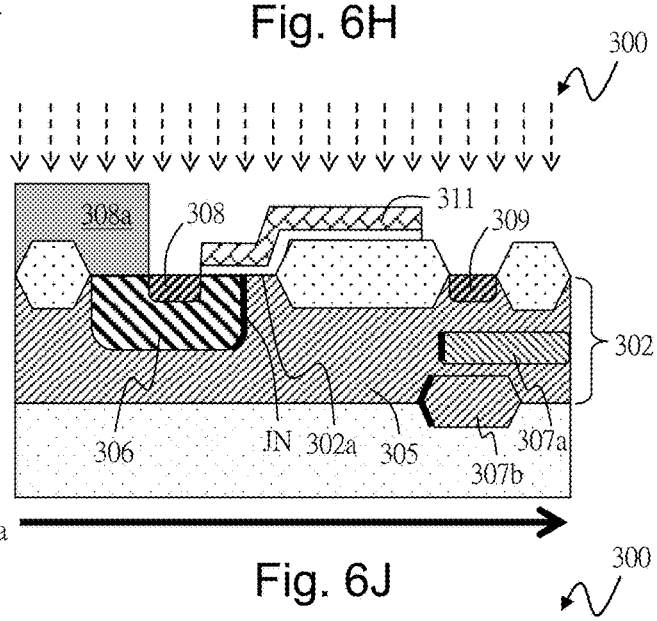

Next, as shown in the top view FIG. 6I and cross-section view FIG. 6J, the source 308 and the drain 309 with the second conductive type (for example but not limited to the N-type) are formed in the epitaxial layer 302, and are stacked beneath and connected to the epitaxial surface 302a in the vertical direction, wherein the source 308 is located in the body region 306 and the drain 309 is formed in the epitaxial layer 302 from the cross-section view FIG. 6J and the top view FIG. 6I. The source 308 and the drain 309 are located at different sides of the PN junction JN, wherein the drain 309 and the gate 311 are separated by the high voltage well 305 from the cross-section view FIG. 6J and the top view FIG. 6I. In an ON operation of the N-type high-side power device 300, a conductive current flows from the N-type drain 309 through the high voltage well 305 and the body region 306 to the source 308. More specifically, by applying a positive voltage to the gate 311 to form a channel around a junction between the P-type body region 306 and the gate 311 in the ON operation, a current flows from the drain 309 to the source 308.

The source 308 and the drain 309 are formed by for example but not limited to a same lithography process step and a same ion implantation process step. As shown in FIG. 6J, the N-type source 308 and the drain 309 are defined by for example but not limited to a photoresist mask 308a formed by the lithography process step and the gate 311, and the ion implantation process step implants for example but not limited to N-type impurities to the defined region in the form of accelerated ions as indicated by the dash arrow lines shown in FIG. 6J. An implantation region of the body region 306 is formed in the substrate 301. The N-type source 308 and the N-type drain 309 are formed beneath and connected to the epitaxial surface 302a.

Figure 6K:
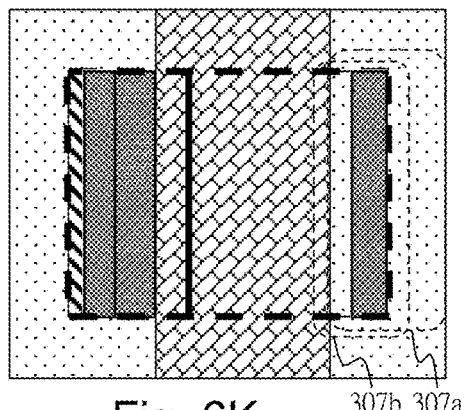
Figure 6L:
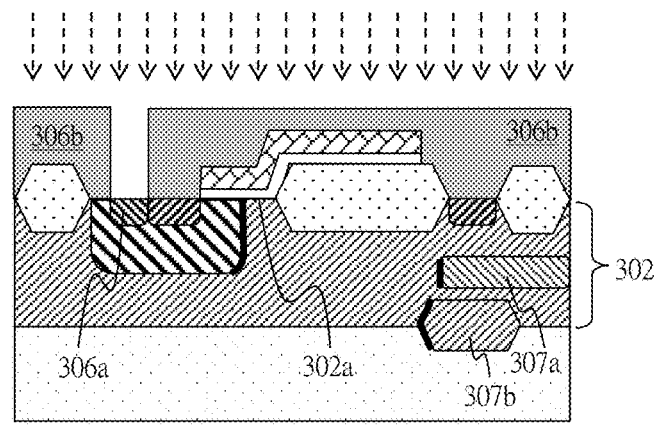

Next, as shown in the top view FIG. 6K and cross-section view FIG. 6L, the contact region 306a with the first conductive type (for example but not limited to the P-type) is formed in the epitaxial layer 302, and is stacked beneath and connected to the epitaxial surface 302a. The contact region 306a is defined by for example but not limited to a photoresist mask 306b formed by a lithography process step, and an ion implantation process step implants for example but not limited to P-type impurities to the defined region in the form of accelerated ions. An implantation region of the contact region 306a is formed in the epitaxial layer 302. Next, the photoresist mask 306b is removed, and next, an anneal process step anneals the P-type impurities in the implantation region of the contact region 306a, to form the contact region 306a.

Figure 7A:
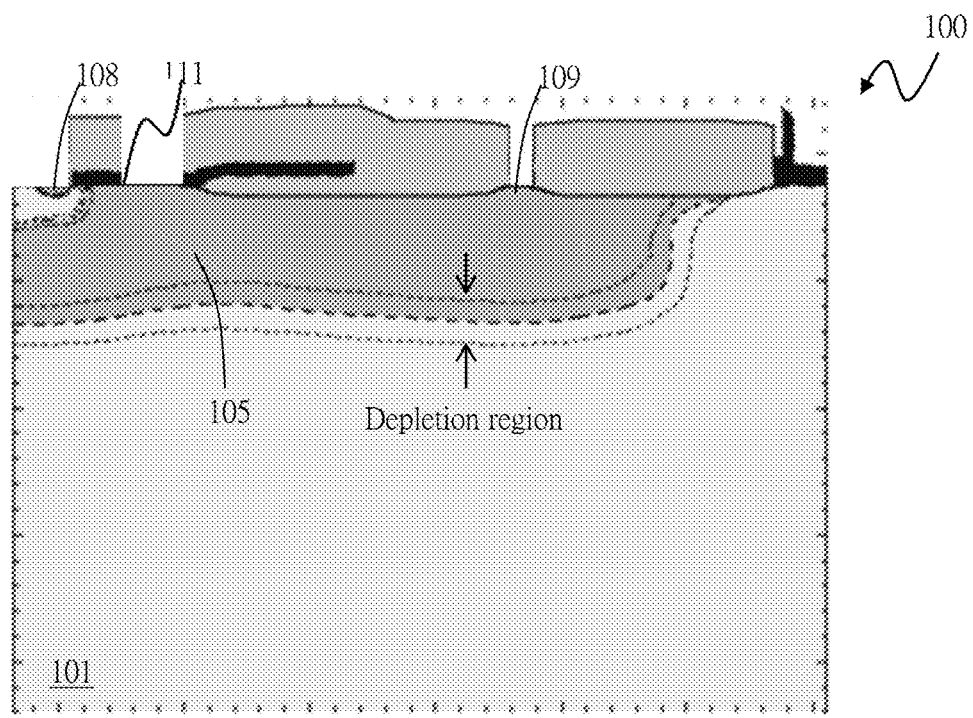
FIGS. 7A and 7B show simulation schematic diagrams of depletion regions of the prior art high-side device 100 when terminals thereof are electrically connected to different voltages.
Figure 7B:
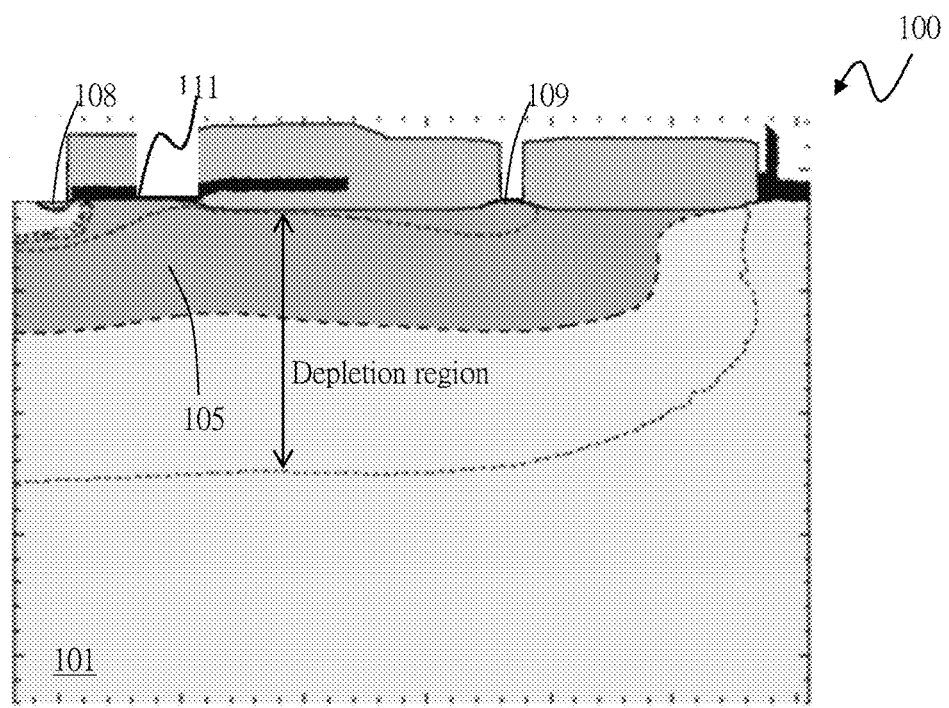

FIGS. 7A and 7B show simulated schematic diagrams of a depletion region of the prior art high-side power device 100 wherein different voltages are applied to terminals therein respectively. FIG. 7A shows the depletion region around a lower boundary of the high voltage well 105 of the high-side power device 100, wherein the depletion region is indicated by a range between an upper dash line and a lower dash line, when 0.1V is applied to the drain 109, and 5V is applied to the gate 111, and the substrate 101 is electrically connected to 0V. A conductive resistance of the high-side power device 100 shown in FIG. 7A is 231 mOhm-mm2. FIG. 7B shows the depletion region around the lower boundary of the high voltage well 105 of the high-side power device 100, wherein the depletion region is indicated by a range between an upper dash line and a lower dash line, when 0.1V is applied to the drain 109, and 5V is applied to the gate 111, and the substrate 101 is electrically connected to −80V. A conductive resistance of the high-side power device 100 shown in FIG. 7B is 1284 mOhm-mm2. In the normal operation of the high-side power device 100, the substrate 101 is electrically connected to a high voltage, for example but not limited to the aforementioned voltage −80V. FIG. 7B shows that the channel of the high-side power device 100 in such normal operation is completely pinched off, resulting in the very high conductive resistance 1284 mOhm-mm2, more than five times of the conductive resistance 231 mOhm-mm2 shown in FIG. 7A.

Figure 8A:
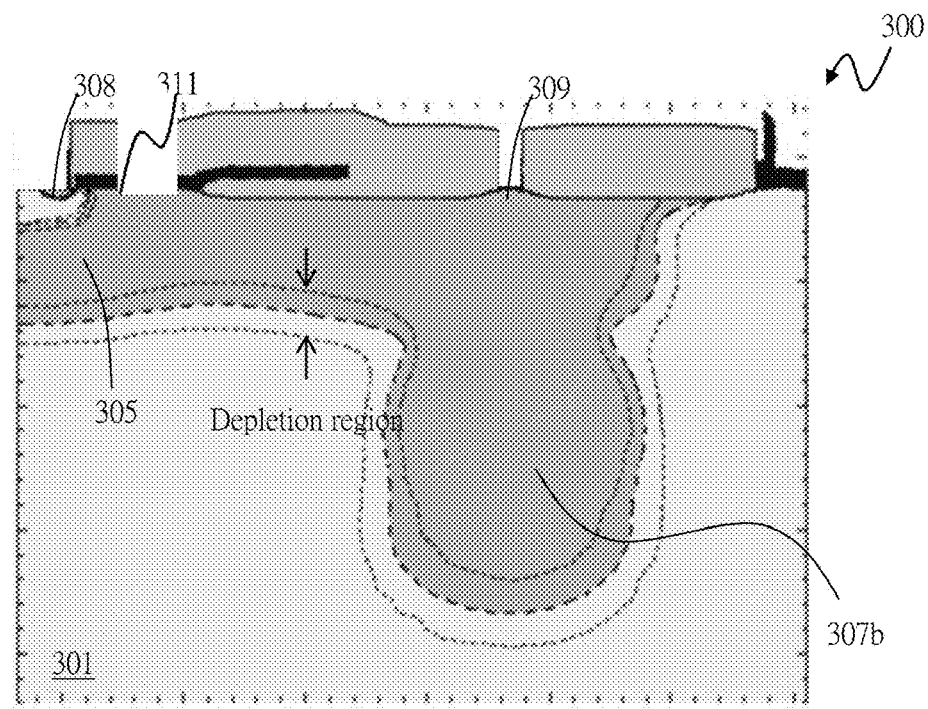
FIGS. 8A and 8B show simulation schematic diagram of depletion regions of the prior art high-side device 300 when terminals thereof are electrically connected to different voltages.
Figure 8B:
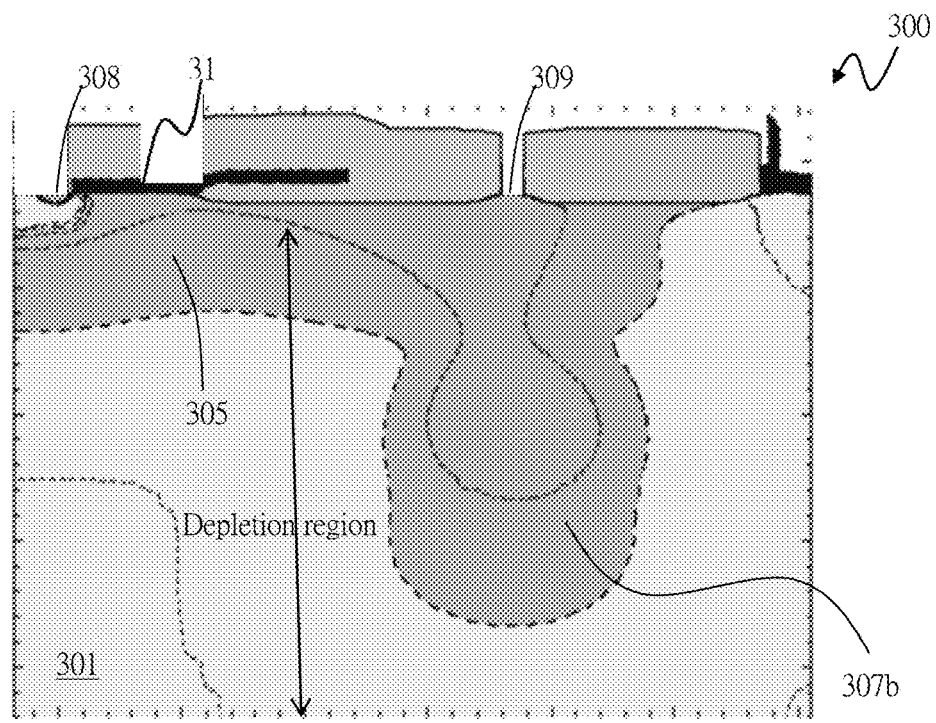

FIGS. 8A and 8B show simulated schematic diagrams of a depletion region of the high-side power device 300 according to the present invention, wherein different voltages are applied to terminals therein respectively. FIG. 8A shows the depletion region around a lower boundary of the high voltage well 305 of the high-side power device 300, wherein the depletion region is indicated by a range between an upper dash line and a lower dash line, when 0.1V is applied to the drain 309, and 5V is applied to the gate 311, and the substrate 301 is electrically connected to 0V. A conductive resistance of the high-side power device 300 shown in FIG. 8A is 226 mOhm-mm2. FIG. 8B shows the depletion region around the lower boundary of the high voltage well 305 of the high-side power device 300, wherein the depletion region is indicated by a range between an upper dash line and a lower dash line, when 0.1V is applied to the drain 309, and 5V is applied to the gate 311, and the substrate 301 is electrically connected to −80V. A conductive resistance of the high-side power device 300 shown in FIG. 8B is 413 mOhm-mm2. In the normal operation of the high-side power device 300, the substrate 301 is electrically connected to a high voltage, for example but not limited to the aforementioned voltage −80V. FIG. 8B shows that when the high-side power device 300 operates in the normal operation, the channel is not completely pinched off, which results in the low conductive resistance 413 mOhm-mm2, less than twice the conductive resistance 226 mOhm-mm2 shown in FIG. 8A. The present invention is apparently advantageous over the prior art in the much lower conductive resistance, and thus broader application.

Figure 8C:
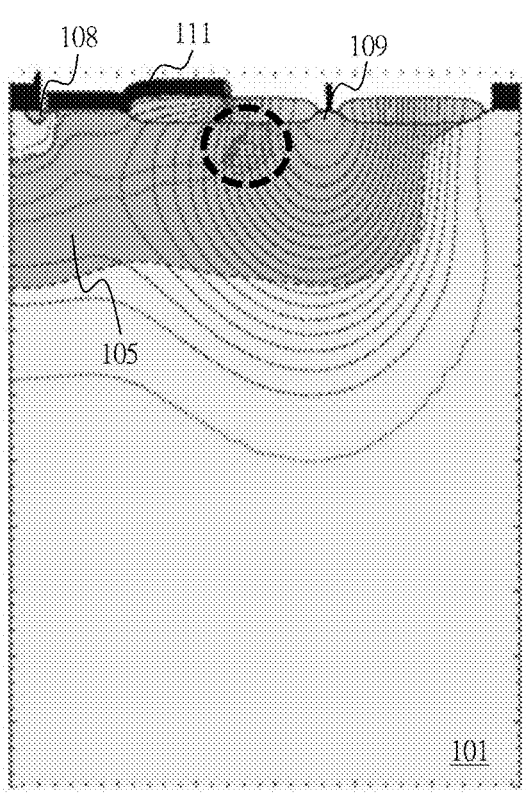
FIGS. 8C and 8D show electron impact ionization schematic diagram of the high-side devices 100 and 300 according to the prior art and the present invention respectively.
Figure 8D:
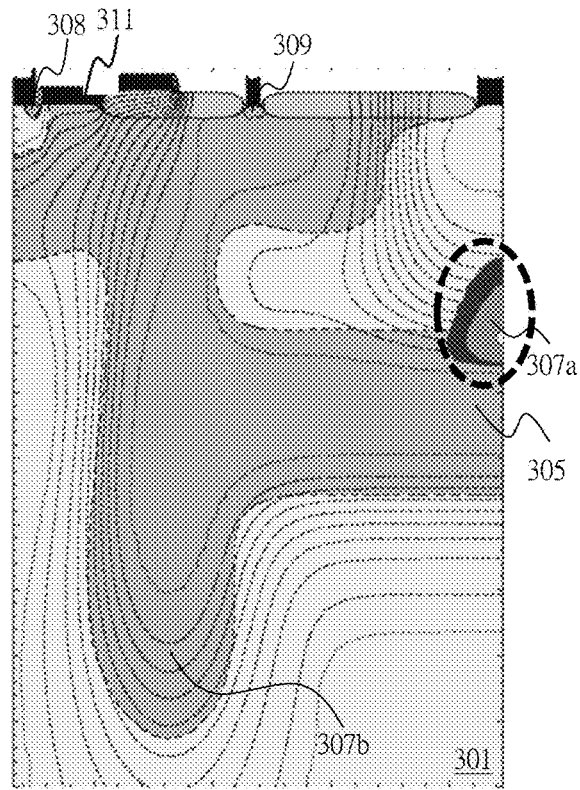

FIGS. 8C and 8D show electron impact ionization schematic diagrams of the high-side devices 100 and 300 according to the prior art and the present invention respectively. As shown by a dashed ellipse in FIG. 8C, under a high electric field, a region with a highest probability of impact to generate electron-hole pairs is in the high voltage well 105 between the body region 106 and the drain region 109, which is a region where breakdown most likely happens. In contrast, as shown by a dashed ellipse in FIG. 8D, under a high electric field, a region with a highest probability of impact to generate electron-hole pairs, i.e., where the breakdown most likely happens, is the junction between the first buried region 307a and the high voltage well 305. Hence, according to the present invention, by adjusting the concentration of impurities of the first buried region 307a, the breakdown voltage during OFF operation can be increased.

Figure 9:
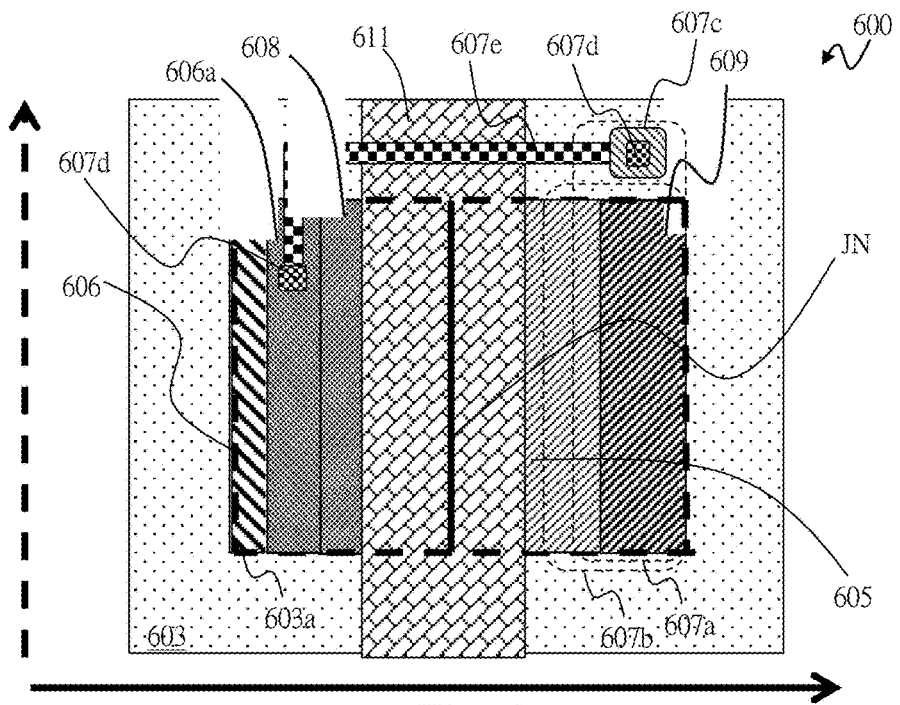
FIG. 9 shows a sixth embodiment of the present invention.

FIG. 9 shows a sixth embodiment of the present invention. FIG. 9 shows a schematic diagram of a top view of a high-side power device 600 according to the present invention. This embodiment is similar to the first embodiment. In this embodiment, as shown in FIG. 9, the high-side power device 600 includes a substrate (not shown, referring to the substrate 201 in the first embodiment), an epitaxial layer (not shown, referring to the epitaxial layer 202 in the first embodiment), an isolation oxide region 603, a high voltage well region 605, a body region 606, a contact region 606a, a first buried region 607a, a second buried region 607b, a connection region 607c, a contact plug 607d, a conductive layer 607e, a source 608, a drain 609, and a gate 611.

This embodiment is different from the first embodiment in that, in this embodiment, the connection region 607c and the contact plug 607d near the drain 609 are located outside the operation region 603a in a width direction (as indicated by the bold dashed arrow shown in the figure). By this layout arrangement, when a high-side power device array includes plural high-side power devices, wherein there are mirror pairs of high-side power devices and each mirror pair of high-side power devices share common source 608, contact region 606a, and drain 609, the unit pitch of one single device is not larger than the prior art, but the breakdown voltage of the present invention is higher. Hence, the performance is better while the manufacturing cost is not increased.

Figure 10:
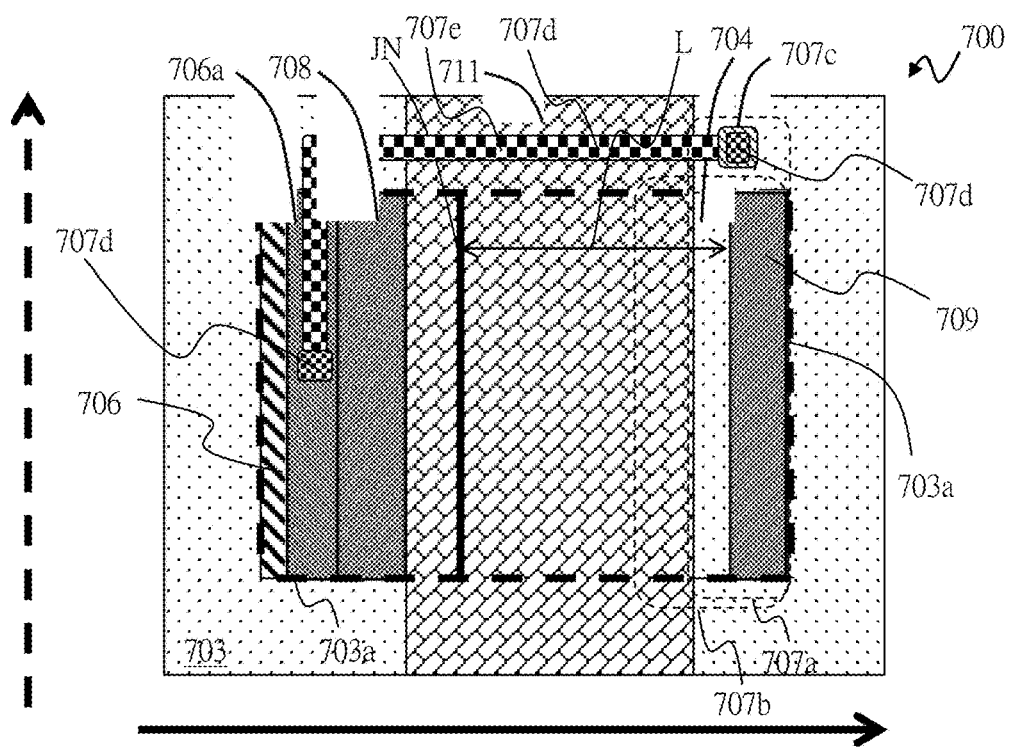
FIG. 10 shows a seventh embodiment of the present invention.

FIG. 10 shows a seventh embodiment of the present invention. FIG. 10 shows a schematic diagram of a top view of a high-side power device 700 according to the present invention. This embodiment is similar to the second embodiment. In this embodiment, as shown in FIG. 10, the high-side power device 700 includes a substrate (not shown, referring to the substrate 301 in the second embodiment), an epitaxial layer (not shown, referring to the epitaxial layer 302 of the second embodiment), an isolation oxide layer 703, a drift oxide region 704, a high voltage well 705, a body region 706, a contact region 706a, a first buried region 707a, a second buried region 707b, a connection region 707c, a contact plug 707d, a conductive layer 707e, a source 708, a drain 709, and a gate 711.

This embodiment differs from the second embodiment in that, in this embodiment, the connection region 707c and the contact plug 707d near the drain 709 are located outside the operation region 703a in a width direction (as indicated by the bold dashed arrow shown in the figure). By this layout arrangement, when a high-side power device array includes plural high-side power devices, wherein there are mirror pairs of high-side power devices and each mirror pair of high-side power devices share common source 708, contact region 706a, and drain 709, the unit pitch of one single device is not larger than the prior art, but the breakdown voltage of the present invention is higher. Hence, the performance is better while the manufacturing cost is not increased.

Figure 11:
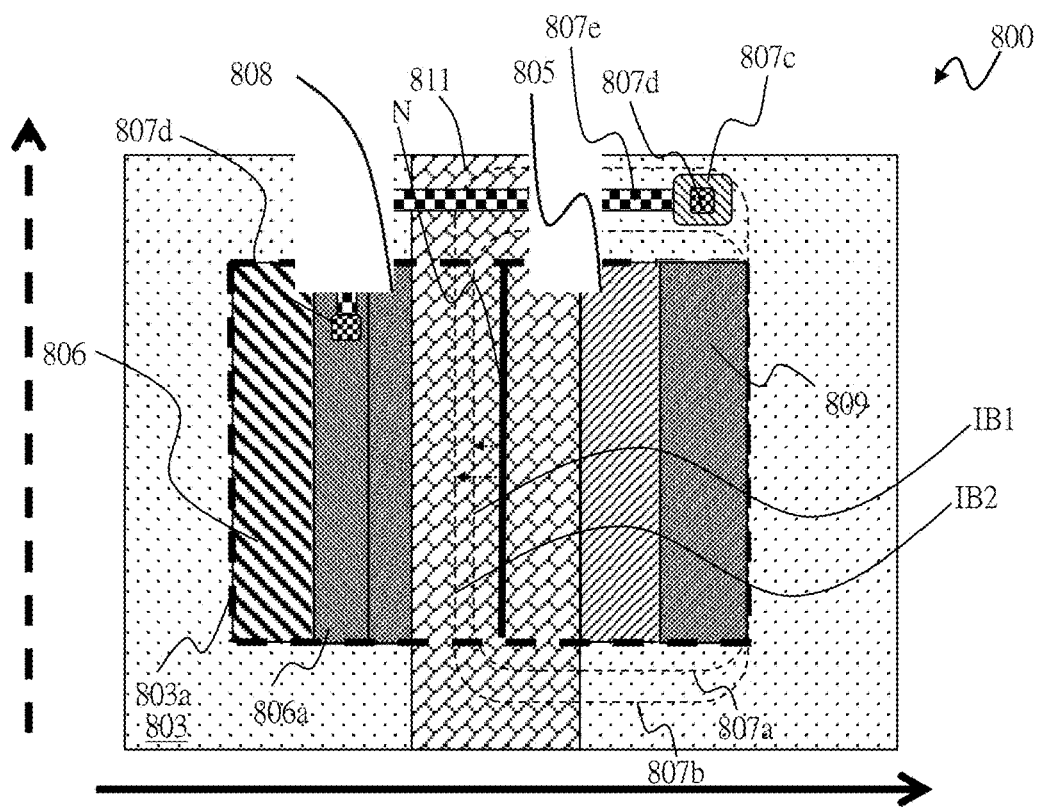
FIG. 11 shows a eighth embodiment of the present invention.

The FIG. 11 shows an eighth embodiment of the present invention. FIG. 11 shows a schematic diagram of a top view of the high-side power device 800 according to the present invention. This embodiment is similar to the third embodiment. In this embodiment, as shown in FIG. 11, the high-side power device 800 includes a substrate (not shown, referring to the substrate 401 in the third embodiment), an isolation oxide region 803, a high voltage welln 805, a body region 806, a contact region 806a, a first buried region 807a, a second buried region 807b, a connection region 807c, a contact plug 807d, a conductive layer 807e, a source 808, a drain 809, and a gate 811.

This embodiment differs from the third embodiment in that, in this embodiment, the connection region 807c and the contact plug 807d near the drain 809 are located outside the operation region 803a in a width direction (as indicated by the bold dashed arrow shown in the figure). By this layout arrangement, when a high-side power device array includes plural high-side power devices, wherein there are mirror pairs of high-side power devices and each mirror pair of high-side power devices share common source 808, contact region 806a, and drain 809, the unit pitch of one single device is not larger than the prior art, but the breakdown voltage of the present invention is higher. Hence, the performance is better while the manufacturing cost is not increased.

Figure 12:
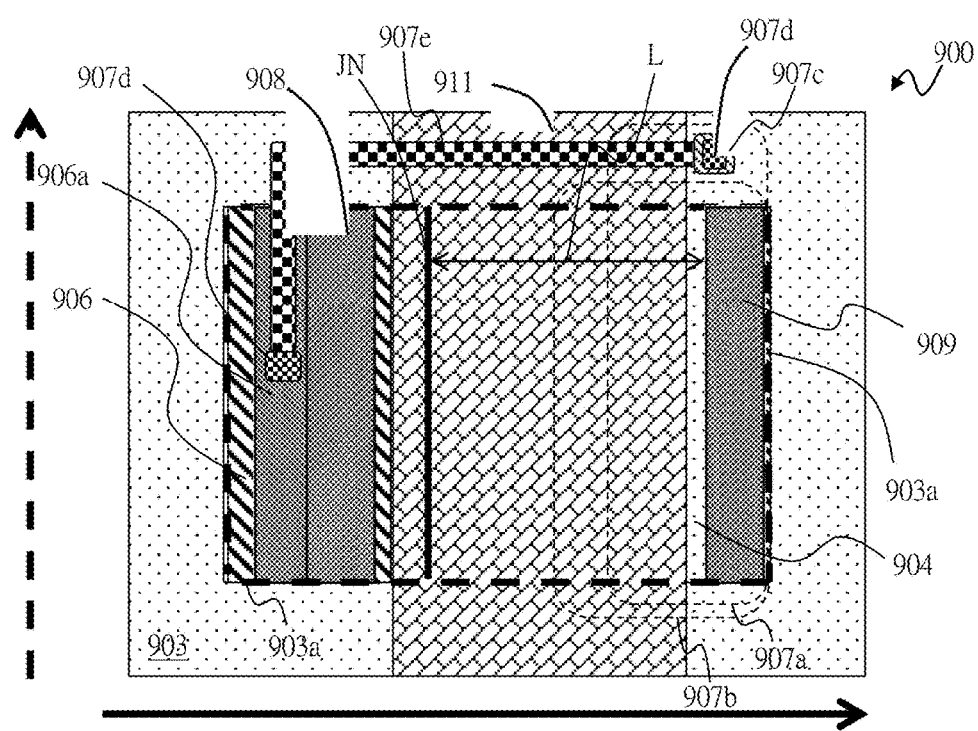
FIG. 12 shows a ninth embodiment of the present invention.

FIG. 12 shows a ninth embodiment of the present invention. FIG. 12 shows a schematic diagram of a top view of the high-side power device 900 according to the present invention. This embodiment is similar to the fourth embodiment. In this embodiment, as shown in FIG. 12, the high-side power device 900 includes a substrate (not shown, referring to the substrate 501 in the fourth embodiment), an epitaxial layer (not shown, referring to the epitaxial layer 502 of the fourth embodiment), an isolation oxide layer 903, a drift oxide region 904, a high voltage well 905, a body region 906, a contact region 906a, a first buried region 907a, a second buried region 907b, a connection region 907c, a contact plug 907d, a conductive Layer 907e, a source 908, a drain 909, and a gate 911.

This embodiment differs from the fourth embodiment in that, in this embodiment, the connection region 907c and the contact plug 907d near the drain 909 are located outside the operation region 903a in a width direction (as indicated by the bold dashed arrow shown in the figure). By this layout arrangement, when a high-side power device array includes plural high-side power devices, wherein there are mirror pairs of high-side power devices and each mirror pair of high-side power devices share common source 908, contact region 906a, and drain 909, the unit pitch of one single device is not larger than the prior art, but the breakdown voltage of the present invention is higher. Hence, the performance is better while the manufacturing cost is not increased.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a threshold voltage adjustment region, etc., can be added; for another example, the lithography process described in the above can be replaced by electron beam lithography or other lithography techniques. For another example, the conductive types of the P-type and the N-type of all the embodiments are interchangeable, with corresponding modifications of conductive types and/or impurity concentrations in other regions. For another example, it is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A high-side power device, comprising:
   a substrate with a first conductive type, which includes a upper surface and a lower surface opposite to the upper surface in a vertical direction;
   an epitaxial layer, which is formed on the substrate, and has an epitaxial surface opposite to the upper surface, wherein the epitaxial layer is stacked on and connected to the upper surface in the vertical direction;
   a high voltage well, which is formed in the epitaxial layer, and has a second conductive type, wherein the high voltage well is stacked on and connected to the upper surface in the vertical direction;
   a body region, which is formed in the epitaxial layer, and has the first conductive type, wherein the body region is stacked under and connected beneath the epitaxial surface in the vertical direction; wherein a PN junction is formed between the body region and the high voltage well;
   a gate, which is formed on the epitaxial layer, wherein at least part of the gate is stacked on and connected to the epitaxial surface in the vertical direction, and wherein the PN junction is located right below the gate from a cross section view, and extends substantially perpendicular to a channel direction from a top view, wherein the gate overlays at least part of the PN junction from the top view;
   a source, which is formed in the epitaxial layer, and has the second conductive type, wherein the source is stacked under and connected beneath the epitaxial surface in the vertical direction, and the source is located in the body region from the top view;
   a drain, which is formed in the epitaxial layer, and has the second conductive type, wherein the drain is stacked under and connected beneath the epitaxial surface in the vertical direction, wherein the source and the drain are located at different sides of the PN junction, and the drain is separated from the gate by the high voltage well from the top view;
   a first buried region, which is formed in the epitaxial layer, and has the first conductive type, wherein the first buried region has a first inner boundary which is an edge of the first buried region that is closest to the gate in the channel direction, wherein the first inner boundary is located between the drain and the PN junction in the channel direction, and the first buried region is not located right below the source; and
   a second buried region, which is formed in the substrate and the epitaxial layer, and has the second conductive type, wherein a part of the second buried region is located in the substrate, and another part of the second buried region is located in the epitaxial layer and is connected to the high voltage well in the vertical direction, wherein the second buried region has a second inner boundary which is an edge of the second buried region that is closest to the gate in the channel direction, wherein the second inner boundary is located between the drain and the PN junction in the channel direction, wherein the second buried region is not located right below the source;
   wherein an impurity concentration of the second conductive type of the second buried region and an impurity concentration of the second conductive type of the high voltage well are above a first predetermined level which is sufficient to prevent the high voltage well between the PN junction and the drain from being completely depleted in an ON operation of the high-side power device.

2. The high-side power device of claim 1, wherein an impurity concentration of the first conductive type of the first buried region and the impurity concentration of the second conductive type of the high voltage well are below a second predetermined level such that the high voltage well between the PN junction and the drain is completely depleted in an OFF operation of the high-side power device.

3. The high-side power device of claim 1, further comprising a connection region which has the first conductive type, and is stacked on and contacting the first buried region in the vertical direction, wherein the connection region is for electrically connecting the first buried region, and the first buried region is electrically connected to the body region.

4. The high-side power device of claim 3, wherein the connection region is located outside an operation region in the channel direction or in a width direction which is perpendicular to the channel direction.

5. The high-side power device of claim 1, further comprising a contact region which is formed in the epitaxial layer, and has the first conductive type, wherein the contact region is stacked under and connected beneath the epitaxial surface in the vertical direction, and the contact region is located in the body region from the top view.

6. The high-side power device of claim 1, wherein a distance between the PN junction and the drain in the channel direction is a drift length, and a length between the second inner boundary and the drain in the channel direction is longer than a quarter of the drift length.

7. The high-side power device of claim 1, wherein the first inner boundary is not located between the second inner boundary and the PN junction in the channel direction.

8. The high-side power device of claim 1, further comprising a drift oxide region which is formed on the epitaxial layer and is stacked on and connected to the high voltage well in the vertical direction, wherein part of the gate overlays the drift oxide region, wherein the drift oxide region is located between the PN junction and the drain in the channel direction.

9. A manufacturing method of a high-side power device, comprising:
   providing a substrate with a first conductive type, which includes a upper surface and a lower surface opposite to the upper surface in a vertical direction;
   forming an epitaxial layer on the substrate, which has an epitaxial surface opposite to the upper surface, and is stacked on and connected to the upper surface in the vertical direction;
   forming a high voltage well in the epitaxial layer, which has the second conductive type, and is stacked on and connected to the upper surface in the vertical direction;

forming a body region in the epitaxial layer, which has the first conductive type, and is stacked under and connected beneath the epitaxial surface in the vertical direction, wherein a PN junction is formed between the body region and the high voltage well;

forming a gate on the epitaxial layer, wherein at least part of the gate is stacked on and connected to the epitaxial surface in the vertical direction, and wherein the PN junction is located right below the gate from a cross section view, and extends substantially perpendicular to a channel direction from a top view, wherein the gate overlays at least part of the PN junction from the top view;

forming a source in the epitaxial layer, which has the second conductive type and is stacked under and connected beneath the epitaxial surface in the vertical direction, and the source is located in the body region from the top view;

forming a drain in the epitaxial layer, which has the second conductive type and is stacked under and connected beneath the epitaxial surface in the vertical direction, wherein the source and the drain are located at different sides of the PN junction, and the drain is separated from the gate by the high voltage well from the top view;

forming a first buried region in the epitaxial layer, which has the first conductive type, wherein the first buried region has a first inner boundary which is an edge of the first buried region that is closest to the gate in the channel direction, wherein the first inner boundary is located between the drain and the PN junction in the channel direction, and the first buried region is not located right below the source; and forming a second buried region in the substrate and epitaxial layer, which has the second conductive type, wherein a part of the second buried region is located in the substrate, and another part of the second buried region is located in the epitaxial layer and is connected to the high voltage well in the vertical direction, wherein the second buried region has a second inner boundary which is an edge of the second buried region that is closest to the gate in the channel direction, wherein the second inner boundary is located between the drain and the PN junction in the channel direction, wherein the second buried region is not located right below the source;

wherein an impurity concentration of the second conductive type of the second buried region and an impurity concentration of the second conductive type of the high voltage well are above a first predetermined level which is sufficient to prevent the PN junction and the drain from being completely depleted in an ON operation of the high-side power device.

10. The manufacturing method of claim 9, wherein an impurity concentration of the first conductive type of the first buried region and the impurity concentration of the second conductive type of the high voltage well are below a second predetermined level such that the high voltage well between the PN junction and the drain is completely depleted in an OFF operation of the high-side power device.

11. The manufacturing method of claim 9, further comprising forming a connection region with the first conductive type, which is stacked on and contacting the first buried region in the vertical direction, wherein the connection region is for electrically connecting the first buried region, and the first buried region is electrically connected to the body region.

12. The manufacturing method of claim 11, wherein the connection region is located outside an operation region in the channel direction or in a width direction which is perpendicular to the channel direction.

13. The manufacturing method of claim 9, further comprising forming a contact region with the first conductive type in the epitaxial layer, wherein the contact region is stacked under and connected beneath the epitaxial surface in the vertical direction, and the contact region is located in the body region from the top view.

14. The manufacturing method of claim 9, wherein a distance between the PN junction and the drain in the channel direction is a drift length, and a length between the second inner boundary and the drain in the channel direction is longer than a quarter of the drift length.

15. The manufacturing method of claim 9, wherein the first inner boundary is not located between the second inner boundary and the PN junction in the channel direction.

16. The manufacturing method of claim 9, further comprising forming a drift oxide region on the epitaxial layer, wherein the drift oxide region is stacked on and contacting the high voltage well in the vertical direction, wherein part of the gate overlays the drift oxide region, wherein the drift oxide region is located between the PN junction and the drain in the channel direction.

17. a high-side power device, comprising:
a substrate with a first conductive type, which includes a upper surface and a lower surface opposite to the upper surface in a vertical direction;

a high voltage well, which is formed beneath the upper surface, and has the second conductive type;

a body region, which is formed in the substrate, and has the first conductive type, wherein the body region is stacked under and connected beneath the upper surface in the vertical direction, wherein a PN junction is formed between the body region and the high voltage well;

a gate, which is formed on substrate, wherein at least part of the gate is stacked on and connected to the upper surface, wherein the PN junction is located right below the gate from a cross section view, and extends substantially perpendicular to a channel direction from a top view, wherein the gate overlays at least part of the PN junction from the top view;

a source, which is formed in the substrate, and has the second conductive type, wherein the source is stacked under and connected beneath the upper surface in the vertical direction, and the source is located in the body region from the top view;

a drain, which is formed in the substrate, and has the second conductive type, wherein the drain is stacked under and connected beneath the upper surface in the vertical direction, wherein the source and the drain are located at different sides of the PN junction, and the drain is separated from the gate by the high voltage well from the top view;

a first buried region, which is formed in the substrate, and has the first conductive type, wherein the first buried region has a first inner boundary which is an edge of the first buried region that is closest to the gate in the channel direction, wherein the first inner boundary is located between the drain and the PN junction in the channel direction, and the first buried region is not located right below the source; and a second buried region, which is formed in the substrate, and has the second conductive type, wherein the second buried region is connected to the high voltage well, wherein the second buried region has a second inner boundary which is an edge of the second buried region that is closest to the gate in the channel direction, wherein the second buried region is not located right below the source;

wherein an impurity concentration of the second conductive type of the second buried region and an impurity concentration of the second conductive type of the high voltage well are above a first predetermined level which is sufficient to prevent the PN junction and the drain from being completely depleted in an ON operation of the high-side power device.

18. The high-side power device of claim 17, wherein an impurity concentration of the first conductive type of the first buried region and the impurity concentration of the second conductive type of the high voltage well are below a second predetermined level such that the high voltage well between the PN junction and the drain is completely depleted in an OFF operation of the high-side power device.

19. The high-side power device of claim 17, further comprising a connection region which has the first conductive type, and is stacked on and contacting the first buried region in the vertical direction, wherein the connection region is for electrically connecting the first buried region, and the first buried region is electrically connected to the body region.

20. The high-side power device of claim 19, wherein the connection region is located outside an operation region in the channel direction or in a width direction which is perpendicular to the channel direction.

21. The high-side power device of claim 17, further comprising a contact region which is formed in the substrate, and has the first conductive type, wherein the contact region is stacked under and connected beneath the upper surface in the vertical direction, and the contact region is located in the body region from the top view.

22. The high-side power device of claim 17, wherein a distance between the PN junction and the drain in the channel direction is a drift length, and a length between the second inner boundary and the drain in the channel direction is longer than a quarter of the drift length.

23. The high-side power device of claim 17, wherein the first inner boundary is not located between the second inner boundary and the PN junction in the channel direction.

24. The high-side power device of claim 17, further comprising a drift oxide region which is formed on the substrate and is stacked on and connected to the high voltage well in the vertical direction, wherein part of the gate overlays the drift oxide region, wherein the drift oxide region is located between the PN junction and the drain in the channel direction.

25. A manufacturing method of a high-side power device, comprising:
providing a substrate with a first conductive type, which includes a upper surface and a lower surface opposite to the upper surface in a vertical direction;
forming a high voltage well with the second conductive type in the substrate;
forming a body region with the first conductive type in the substrate, wherein the body region is stacked under and connected beneath the upper surface in the vertical direction, wherein a PN junction is formed between the body region and the high voltage well;
forming a gate on substrate, wherein at least part of the gate is stacked on and connected to the upper surface, wherein a PN junction is formed between the body region and the high voltage well, wherein the PN junction is located right below the gate from a cross section view, and extends substantially perpendicular to a channel direction from a top view, wherein the gate overlays at least part of the PN junction from the top view;
forming a source with the second conductive type in the substrate, wherein the source is stacked under and connected beneath the upper surface in the vertical direction, and the source is located in the body region from the top view;
forming a drain with the second conductive type in the substrate, wherein the drain is stacked under and connected beneath the upper surface in the vertical direction, wherein the source and the drain are located at different sides of the PN junction, and the drain is separated from the gate by the high voltage well from the top view;
forming a first buried region with the first conductive type in the substrate, wherein the first buried region has a first inner boundary which is an edge of the first buried region that is closest to the gate in the channel direction, wherein the first inner boundary is located between the drain and the PN junction in the channel direction, and the first buried region is not located right below the source; and
forming a second buried region with the second conductive type in the substrate, wherein the second buried region is connected to the high voltage well, wherein the second buried region has a second inner boundary which is an edge of the second buried region that is closest to the gate in the channel direction, wherein the second buried region is not located right below the source;
wherein an impurity concentration of the second conductive type of the second buried region and an impurity concentration of the second conductive type of the high voltage well are above a first predetermined level which is sufficient to prevent the PN junction and the drain from being completely depleted in an ON operation of the high-side power device.

26. The manufacturing method of claim 25, wherein an impurity concentration of the first conductive type of the first buried region and the impurity concentration of the second conductive type of the high voltage well are below a second predetermined level such that the high voltage well between the PN junction and the drain is completely depleted in an OFF operation of the high-side power device.

27. The manufacturing method of claim 25, further comprising forming a connection region with the first conductive type, which is stacked on and contacting the first buried region in the vertical direction, wherein the connection region is for electrically connecting the first buried region, and the first buried region is electrically connected to the body region.

28. The manufacturing method of claim 27, wherein the connection region is located outside an operation region in the channel direction or in a width direction which is perpendicular to the channel direction.

29. The manufacturing method of claim 25, further comprising forming a contact region with the first conductive type in the substrate, wherein the contact region is stacked under and connected beneath the upper surface in the vertical direction, and the contact region is located in the body region from the top view.

30. The manufacturing method of claim 25, wherein a distance between the PN junction and the drain in the channel direction is a drift length, and a length between the second inner boundary and the drain in the channel direction is longer than a quarter of the drift length.

31. The manufacturing method of claim 25, wherein the first inner boundary is not located between the second inner boundary and the PN junction in the channel direction.

32. The manufacturing method of claim 25, further comprising forming a drift oxide region on the epitaxial layer, wherein the drift oxide region is stacked on and connected to the high voltage well in the vertical direction, wherein part of the gate overlays the drift oxide region, wherein the drift oxide region is located between the PN junction and the drain in the channel direction.

* * * * *